(12) United States Patent
Agrawal et al.

(10) Patent No.: US 6,204,686 B1
(45) Date of Patent: Mar. 20, 2001

(54) METHODS FOR CONFIGURING FPGA'S HAVING VARIABLE GRAIN BLOCKS AND SHARED LOGIC FOR PROVIDING SYMMETRIC ROUTING OF RESULT OUTPUT TO DIFFERENTLY-DIRECTED AND TRISTATEABLE INTERCONNECT RESOURCES

(75) Inventors: Om P. Agrawal, Los Altos; Bradley A. Sharpe-Geisler, San Jose; Herman M. Chang, Cupertino; Bai Nguyen; Giap H. Tran, both of San Jose, all of CA (US)

(73) Assignee: Vantis Corporation, San Jose, CA (US)

( * ) Notice: Subject to any disclaimer, the term of this patent is extended or adjusted under 35 U.S.C. 154(b) by 0 days.

(21) Appl. No.: 09/216,662

(22) Filed: Dec. 16, 1998

(51) Int. Cl.[7] .................................................. G06F 7/38
(52) U.S. Cl. ................................. 326/39; 326/41; 326/38
(58) Field of Search .......................................... 326/37–41

(56) References Cited

U.S. PATENT DOCUMENTS

| | | | |
|---|---|---|---|
| 5,504,440 | * | 4/1996 | Sasaki ..................................... 326/41 |
| 5,815,003 | * | 9/1998 | Pedersen ................................. 326/39 |
| 5,900,743 | * | 5/1999 | McClintock et al. ................... 326/41 |
| 5,920,202 | * | 7/1999 | Young et al. ............................ 326/41 |
| 6,020,755 | * | 2/2000 | Andrews et al. ....................... 326/39 |
| 6,026,227 | * | 2/2000 | Furtek et al. ........................... 716/16 |

* cited by examiner

Primary Examiner—Michael Tokar
Assistant Examiner—Anh Tran
(74) Attorney, Agent, or Firm—Fliesler, Dubb, Meyer & Lovejoy LLP

(57) ABSTRACT

A Variable Grain Architecture (VGA) device includes a shared output component (SOC) that may be used for programmably-routing process result signals onto either or plural ones of differently directed longlines within an FPGA. Plural VGB's make shared use of each SOC to output respective function signals to the longlines. The SOC may be also used for programmably-routing signals (e.g., feedthrough signals) that are selectively acquired from either one of equivalent but differently positioned interconnect channels. Such freedom in routing VGB result signals or feedthrough signals can allow FPGA configuring software to explore a wider range of partitioning, placement and/or routing options for finding optimized implementations in the VGA FPGA device of various, supplied design specifications.

33 Claims, 15 Drawing Sheets

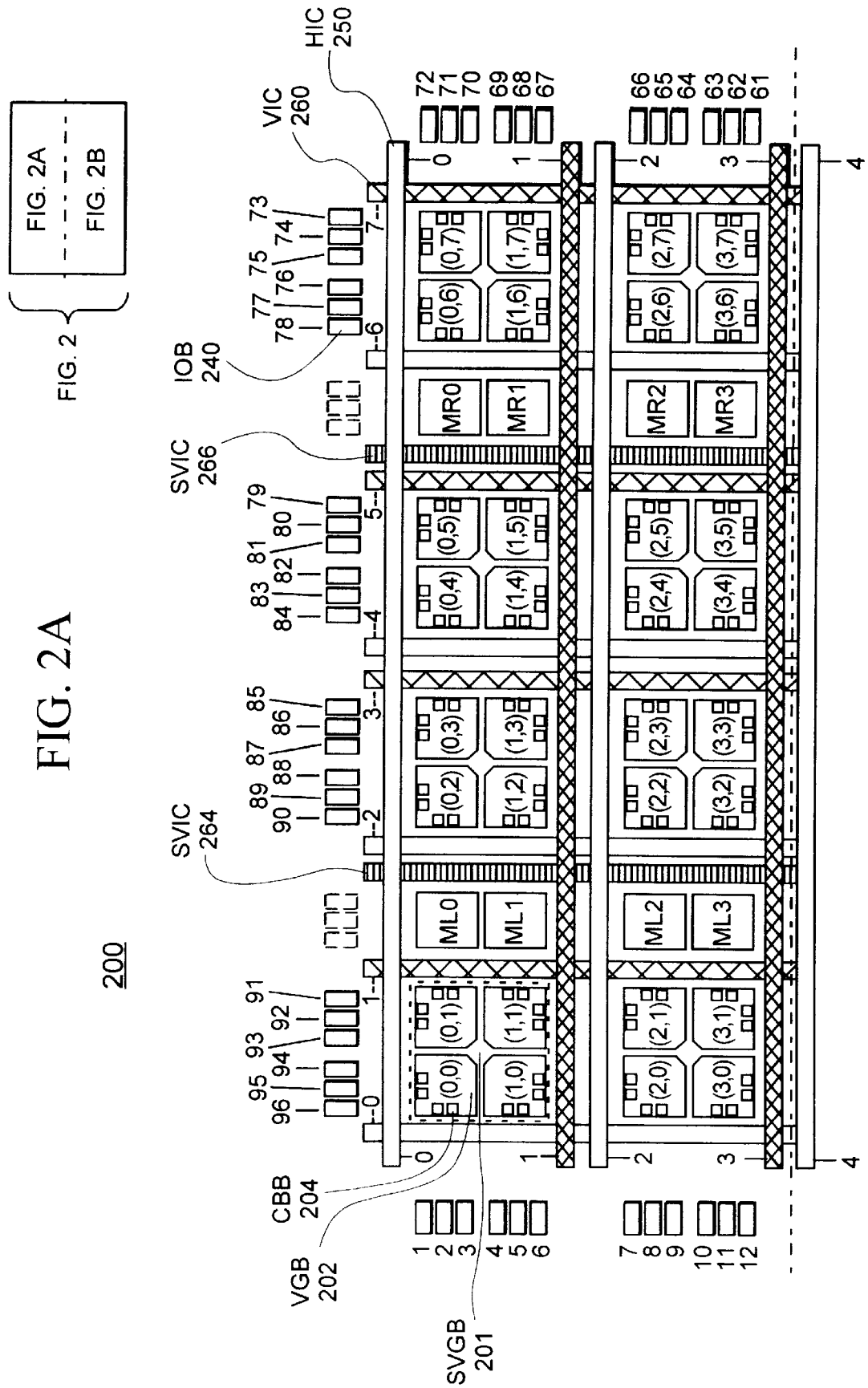

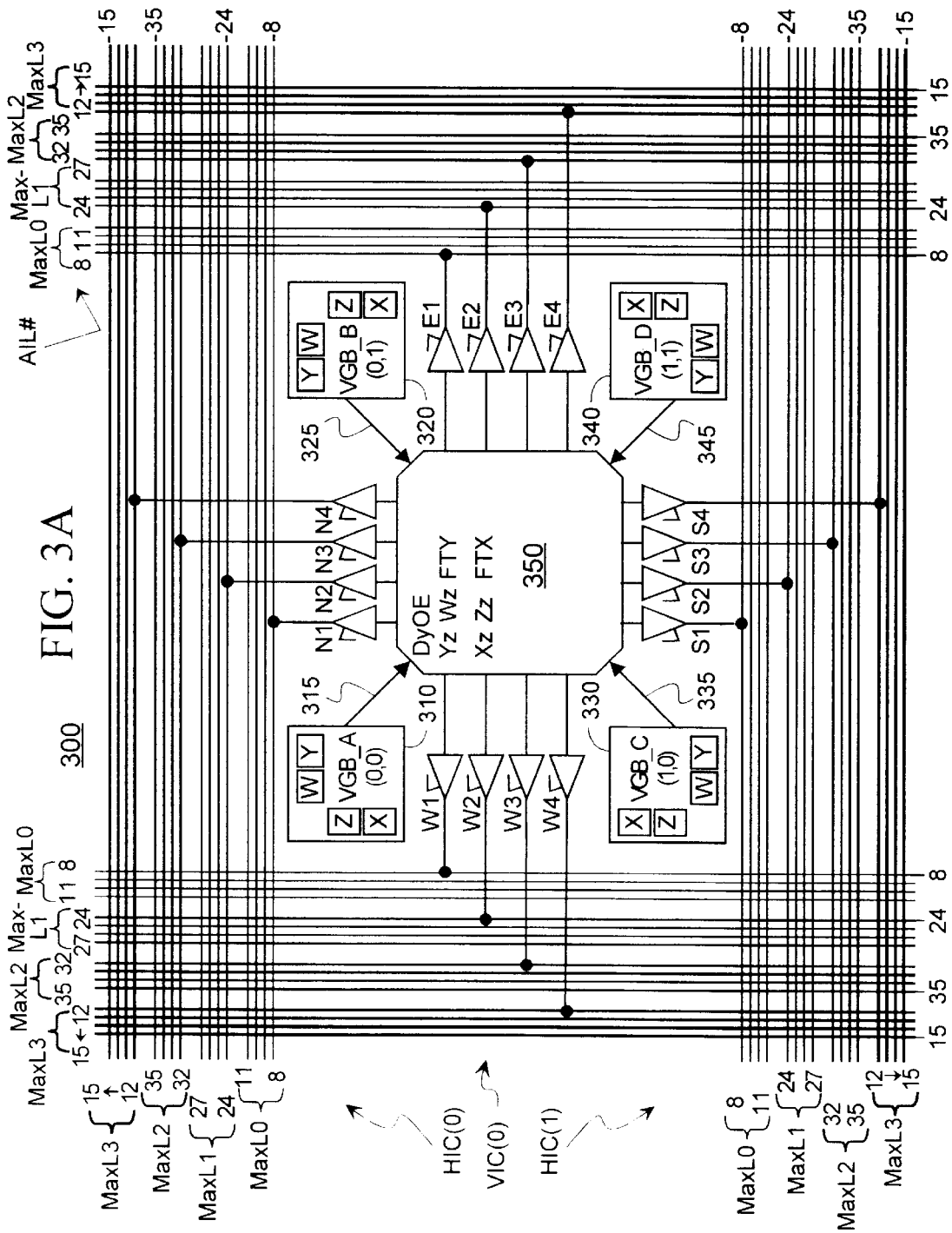

FIG. 4B

| LLDi | DyOE_J | SupOE_J' | J_Kz0 (IN0) | J_Kz1 (IN1) | J'_Kz2 (IN2) | J'_Kz3 (IN3) | FTK_J0 (IN4) | FTK_J1 (IN5) | FTK_J'2 (IN6) | FTK_J'3 (IN7) |
|---|---|---|---|---|---|---|---|---|---|---|
| N1 | DyOE_A | DyOE_B | B_Yz | B_Xz | A_Yz | A_Xz | FTX1_B | FTX2_B | FTX1_A | FTX2_A |
| N2 | DyOE_A | DyOE_B | B_Wz | B_Zz | A_Wz | A_Zz | FTX1_B | FTX2_B | FTX1_A | FTX2_A |
| N3 | DyOE_A | DyOE_B | B_Yz | B_Zz | A_Yz | A_Zz | FTX1_B | FTX2_B | FTX1_A | FTX2_A |
| N4 | DyOE_A | DyOE_B | B_Wz | B_Xz | A_Wz | A_Xz | FTX1_B | FTX2_B | FTX1_A | FTX2_A |
| E1 | DyOE_B | DyOE_D | D_Xz | D_Yz | B_Xz | B_Yz | FTY1_D | FTY2_D | FTY1_B | FTY2_B |
| E2 | DyOE_B | DyOE_D | D_Zz | D_Wz | B_Zz | B_Wz | FTY1_D | FTY2_D | FTY1_B | FTY2_B |
| E3 | DyOE_B | DyOE_D | D_Xz | D_Wz | B_Xz | B_Wz | FTY1_D | FTY2_D | FTY1_B | FTY2_B |
| E4 | DyOE_B | DyOE_D | D_Zz | D_Yz | B_Zz | B_Yz | FTY1_D | FTY2_D | FTY1_B | FTY2_B |
| S1 | DyOE_D | DyOE_C | C_Yz | C_Xz | D_Yz | D_Xz | FTX1_C | FTX2_C | FTX1_D | FTX2_D |
| S2 | DyOE_D | DyOE_C | C_Wz | C_Zz | D_Wz | D_Zz | FTX1_C | FTX2_C | FTX1_D | FTX2_D |
| S3 | DyOE_D | DyOE_C | C_Yz | C_Xz | D_Yz | D_Xz | FTX1_C | FTX2_C | FTX1_D | FTX2_D |
| S4 | DyOE_D | DyOE_C | C_Wz | C_Zz | D_Wz | D_Zz | FTX1_C | FTX2_C | FTX1_D | FTX2_D |
| W1 | DyOE_C | DyOE_A | A_Xz | A_Yz | C_Xz | C_Yz | FTY1_A | FTY2_A | FTY1_C | FTY2_C |
| W2 | DyOE_C | DyOE_A | A_Zz | A_Wz | C_Zz | C_Wz | FTY1_A | FTY2_A | FTY1_C | FTY2_C |
| W3 | DyOE_C | DyOE_A | A_Xz | A_Wz | C_Xz | C_Wz | FTY1_A | FTY2_A | FTY1_C | FTY2_C |
| W4 | DyOE_C | DyOE_A | A_Zz | A_Yz | C_Zz | C_Yz | FTY1_A | FTY2_A | FTY1_C | FTY2_C |
| | FROM COMMON CONTROL SECTION 580 | | NAME OF SOURCE VGB_ & CBB SIGNAL FROM THAT SOURCE VGB_ | | | | FEEDTHROUGHS (FROM NAMED, SOURCE VGB_A, _B, _C OR _D | | | |

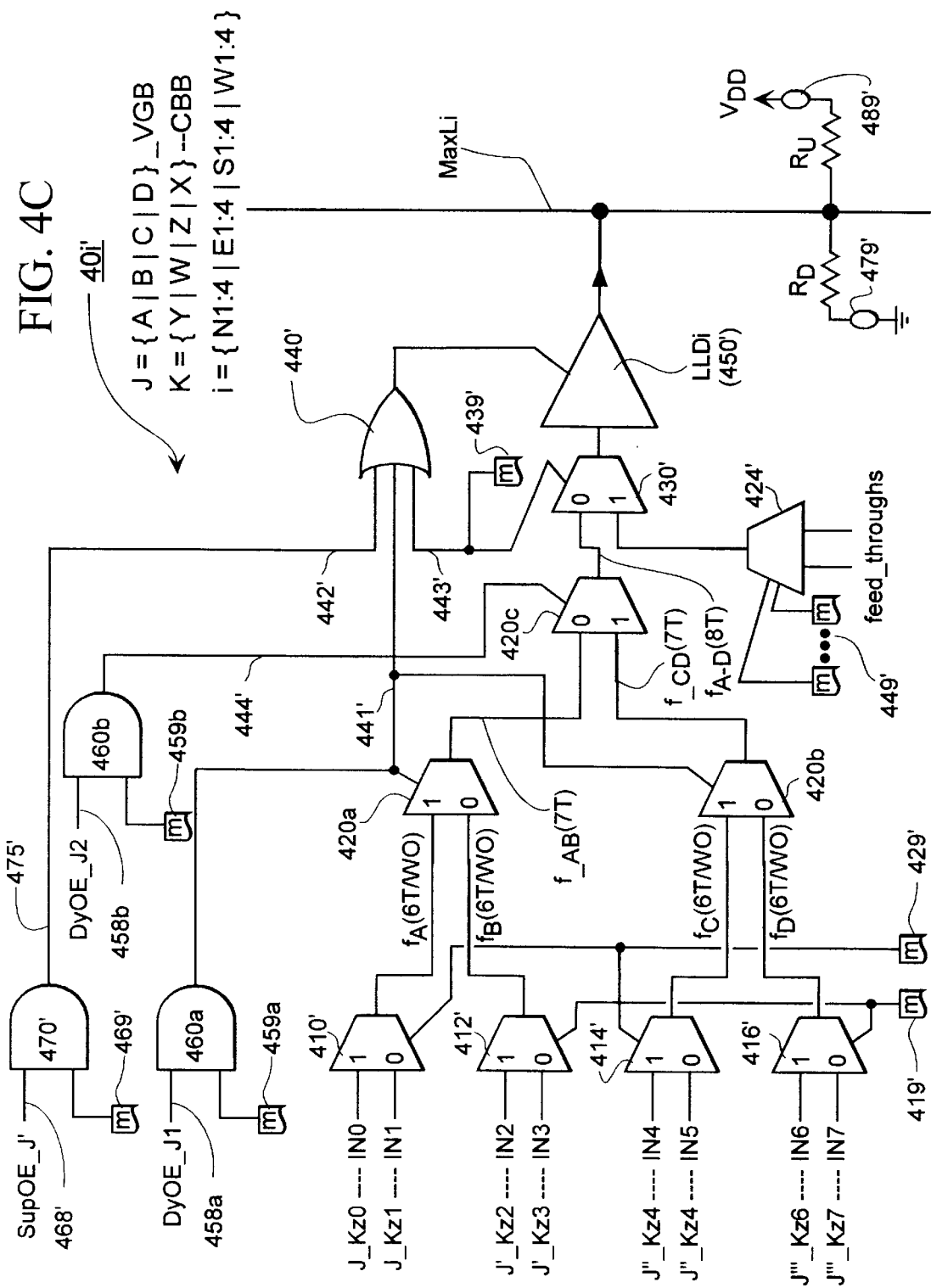

METHODS FOR CONFIGURING FPGA'S HAVING VARIABLE GRAIN BLOCKS AND SHARED LOGIC FOR PROVIDING SYMMETRIC ROUTING OF RESULT OUTPUT TO DIFFERENTLY-DIRECTED AND TRISTATEABLE INTERCONNECT RESOURCES

CROSS REFERENCE TO RELATED APPLICATIONS

The following co-pending U.S. patent applications are owned by the owner of the present application and their disclosures are incorporated herein by reference:

(A) Ser. No. 08/948,306 filed Oct. 9, 1997 by Om P. Agrawal et al. and originally entitled, "VARIABLE GRAIN ARCHITECTURE FOR FPGA INTEGRATED CIRCUITS";

(B) Ser. No. 08/996,361 filed Dec. 22, 1997, by Om Agrawal et al. and originally entitled, "SYMMETRICAL, EXTENDED AND FAST DIRECT CONNECTIONS BETWEEN VARIABLE GRAIN BLOCKS IN FPGA INTEGRATED CIRCUITS";

(C) Ser. No. 08/995,615 filed Dec. 22, 1997, by Om Agrawal et al. and originally entitled, "A PROGRAMMABLE INPUT/OUTPUT BLOCK (IOB) IN FPGA INTEGRATED CIRCUITS";

(D) Ser. No. 08/995,614 filed Dec. 22, 1997, by Om Agrawal et al. and originally entitled, "INPUT/OUTPUT BLOCK (IOB) CONNECTIONS TO MAXL LINES, NOR LINES AND DENDRITES IN FPGA INTEGRATED CIRCUITS";

(E) Ser. No. 08/995,612 filed Dec. 22, 1997, by Om Agrawal et al. and originally entitled, "FLEXIBLE DIRECT CONNECTIONS BETWEEN INPUT/OUTPUT BLOCKs (IOBs) AND VARIABLE GRAIN BLOCKs (VGBs) IN FPGA INTEGRATED CIRCUITS";

(F) Ser. No. 08/997,221 filed Dec. 22, 1997, by Om Agrawal et al. and originally entitled, "PROGRAMMABLE CONTROL MULTIPLEXING FOR INPUT/OUTPUT BLOCKs (IOBs) IN FPGA INTEGRATED CIRCUITS";

(G) Ser. No. 09/008,762 filed Jan. 19, 1998 by Om P. Agrawal et al. and originally entitled, "SYNTHESIS-FRIENDLY FPGA ARCHITECTURE WITH VARIABLE LENGTH AND VARIABLE TIMING INTERCONNECT";

(H) Ser. No. 08/996,049 filed Dec. 22, 1997 by Om P. Agrawal et al. and originally entitled, "DUAL PORT SRAM MEMORY FOR RUN-TIME USE IN FPGA INTEGRATED CIRCUITS; and (I) Ser. No. 09/212,330 filed Dec. 15, 1998 by Om P. Agrawal et al. and originally entitled, "METHODS FOR CONFIGURING FPGA'S HAVING VARIABLE GRAIN BLOCKS AND SHARED LOGIC FOR PROVIDING TIME-SHARED ACCESS TO INTERCONNECT RESOURCES".

CROSS REFERENCE TO RELATED PATENTS

The following U.S. patent(s) are related to the present application and their disclosures are incorporated herein by reference:

(A) U.S. Pat. No. 5,212,652 issued May 18, 1993 to Om Agrawal et al, (filed as Ser. No. 07/394,221 on Aug. 15, 1989) and entitled, PROGRAMMABLE GATE ARRAY WITH IMPROVED INTERCONNECT STRUCTURE;

(B) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES; and (C) U.S. Pat. No. 5,185,706 issued Feb. 9, 1993 to Om Agrawal et al.

BACKGROUND

1. Field of the Invention

The invention relates generally to integrated circuits having repeated logic and interconnect structures provided therein. The invention relates more specifically to providing symmetric routability to a limited number of tristateable interconnect resources within field programmable gate arrays (FPGA's).

2. Description of the Related Art

As density within integrated circuits (IC's) of digital logic circuitry increases, and as signal processing speed of such logic also increases, the ability to couple respective signals to an appropriate kinds of interconnect resource becomes more difficult.

Artisans have begun to recognize that conductors of different lengths and orientations should be provided in combination with different, line-driving amplifiers for servicing different kinds of signals in programmable logic arrays. By way of example, a first class of relatively long and relatively low-resistance conductors are included with high-powered, tristate line-drivers for broadcasting common control signals (e.g., clock, clock enable, etc.) over relatively large distances of the IC device with minimal skew. Such special conductors are sometimes referred to as tristateable, low-skew longlines.

As a further example, some wire segments are dedicated for transmitting logic input and logic output signals between immediately adjacent logic sections without routing through general switch matrices. These dedicated conductors are sometimes referred to as direct-connect lines and their correspondingly adapted line-drivers are sometimes referred to as direct-connect drivers.

At the same time that specialized conductors and line-drivers are provided, artisans strive to continue to provide field programmable logic arrays with general-purpose conductors, general-purpose routing switches and general-purpose line-drivers for carrying out general-purpose, sourcing and programmable routing of signals.

With all different kinds of conductors and line-drivers competing for space within an IC, the numbers of drivers and conductors for each kind of specialized interconnect resource (e.g., longlines) at each location can become a relatively limited resource. Every signal within a complex design cannot be allowed to have its own dedicated interconnect line and line-driver. If it were otherwise, the limited interconnect resources of the field-programmable array device would soon be exhausted. Fortunately, many designs allow for the transmission of plural signals at different times over a shared interconnect line. Such sharing may come in the form of time-domain multiplexing or burst-mode operations.

A number of different circuit techniques have been developed for allowing multiple signals to share a same interconnect line. Multiple tristate drivers may be used for example, with each tristate driver becoming a line master at a different time while the other tristate drivers of the same line go into a high-impedance output mode. The line-driving signal of that moment then passes without contention onto the shared line through its line-mastering, tristate (three state) driver.

In an alternative approach, a shared wire is urged towards a predefined logic state by means of a pull-up or pull-down resistor. An open-drain technology is then used to implement a wired-OR circuit on the urged line. Sharing signals OR into the shared line at different times. If desired, a logical ORring of simultaneous signals may be carried out on the so-driven line.

A third approach provides a dedicated multiplexer for driving the shared line. At each given time, an appropriately desired signal is selected by the dedicated multiplexer for output onto the shared line.

Each of these approaches has benefits and drawbacks. Tristate drivers tend to consume more circuit area than two-state drivers. They also generally need specialized control circuits for controlling their output-enable (OE) terminals so that contention and crowbar currents will be avoided. On the other hand, chip-internal tristate buses may be made extensible with off-chip tristate buses.

Wired-OR circuits have the drawback of tending to consume more power than purely CMOS circuits. Dedicated multiplexers are wasteful if it happens that their full selection capabilities are not utilized in a given design implementation. Also, signals on directly-multiplexed buses (without tristate capability) cannot be easily exchanged between off-chip and chip-internal circuits.

Given this, use of chip-internal tristate buses and chip-internal tristate drivers can be highly advantageous if they are used with minimal wastage of circuit space and maximal flexibility in terms of routing signals towards different directions.

SUMMARY OF THE INVENTION

An improved resource-sharing scheme in accordance with the invention allows individual ones of signal sourcing components of a Variable Grain Architecture (VGA) device to symmetrically direct result outputs to tristate line-drivers of a programmably-selectable one or more of plural and differently directed interconnect channels. Such programmably-selectable line-driving resources may be each disposed within a respective one of plural Super Variable Grain Blocks (SVGB's) for permitting each SVGB to be programmably-configured to broadcast its result signals either along one or along plural and differently-directed channels.

Other aspects of the invention will become apparent from the below detailed description.

BRIEF DESCRIPTION OF THE DRAWINGS

The below detailed description makes reference to the accompanying drawings, in which:

FIGS. 3A, 3B, 3C, 3D respectively are schematics of connections of the shared, big drives to adjacent interconnect lines for super-VGB's (0,0), (1,1), (2,2) and (3,3) of a matrix of such super-VGB's;

FIG. 4B is a matrix showing input and control connections for one plurality of circuits such as shown in FIG. 4A;

FIG. 4C is a schematic of an alternate shared, big drive logic for folding together the resources of 4 VGB's;

DETAILED DESCRIPTION

Figure 1A:
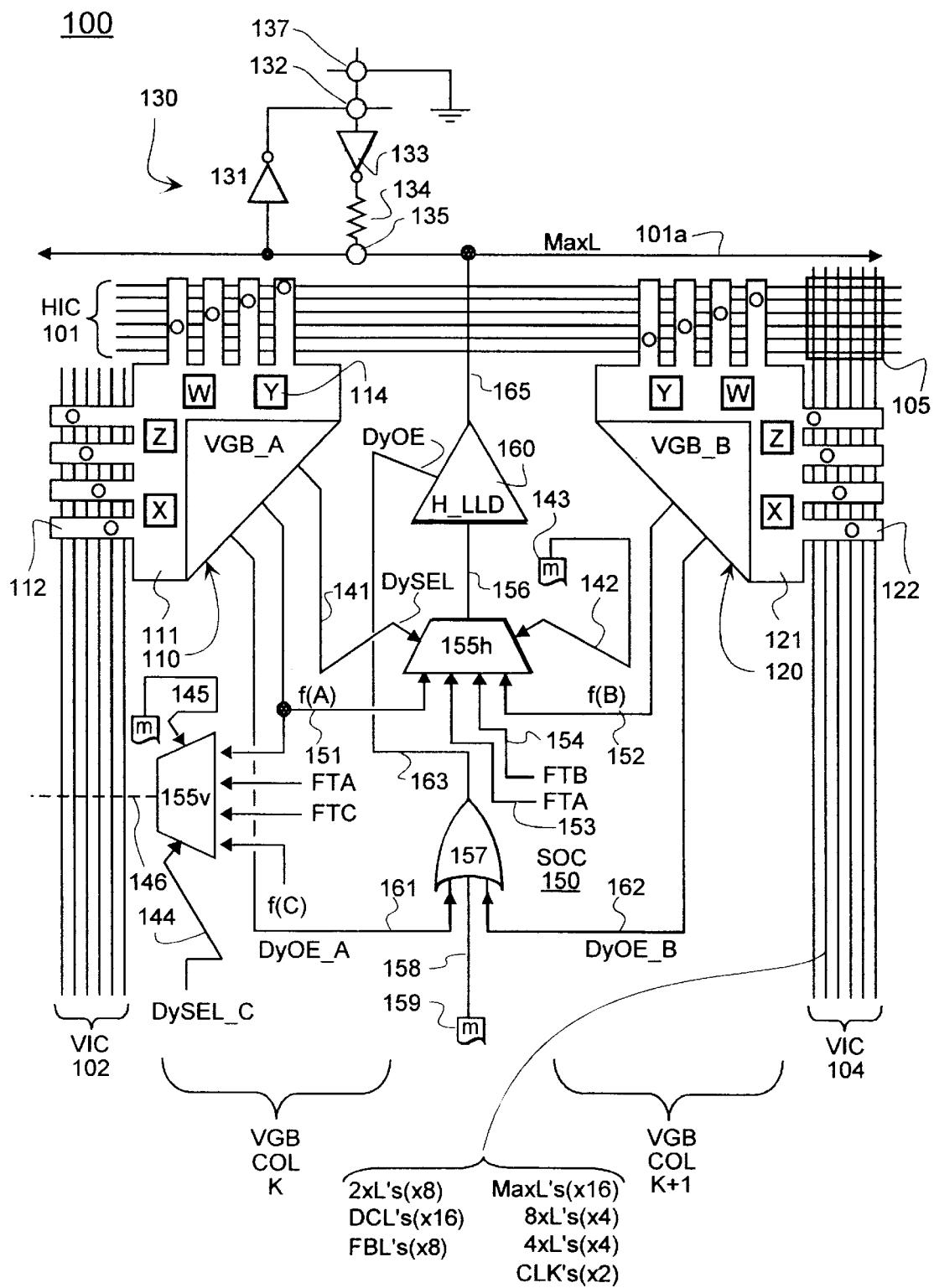
FIG. 1A provides a schematic diagram for explaining how, in one embodiment, each variable grain block (VGB) has programmably-selectable access to two longline-drivers of respectively, orthogonal interconnect channels and how access to each longline driver may be shared by two VGB's.

FIG. 1A provides a schematic diagram of a portion 100 of an FPGA integrated circuit (IC) device in accordance with the invention. IC portion 100 includes a horizontally-extending interconnect channel (HIC) 101, a vertically-extending, first interconnect channel (VIC) 102 and a vertically-extending, second interconnect channel (VIC) 104. A first switchboxes area (not shown) is provided at the intersection of HIC 101 and VIC 102. A second switchboxes area 105 is provided at the intersection of HIC 101 and VIC 104. Each switchboxes area (e.g., 105) includes a plurality of programmably-configurable switchboxes for selectively routing signals through the switchboxes area. Signals may continue along the same linear direction in which they enter the switchboxes area. Signals may also be routed so as to continue in an orthogonal direction along a conductor within a correspondingly orthogonal interconnect channel. The second switchboxes area 105 is mirror-symmetrical with the first switchboxes area (not shown).

Each of HIC 101 and VIC's 102, 104 includes a same set of diversified interconnect conductors. In one embodiment these diversified conductors include eight, VGB intra-connecting feedback lines (FBL's), 16 direct connect lines (DCL's), eight double-length conductors (2×L's), four quad-length conductors (4×L's), four octal-length conductors (8×L's) and 16 maximum-length conductors (MaxL's). Although not shown, each of HIC 101 and VIC's 102, 104 further includes two dedicated clock lines of maximum length.

Full explanations of uses for each of the diversified interconnect conductors mentioned here (FBL's through MaxL's) may be found in at least one of the above-cited patent applications. In brief, 2×L conductors each extend continuously and linearly for a distance of two variable grain structures known as VGB's. Element 110 is one such structure (VGB_A). Item 120 is another such structure (VGB_B). VGB_A and VGB_B belong to an array of such structures. See FIG. 2.

Each 4×L conductor extends continuously and linearly alongside four successive VGB's. Most 8×L conductors each extend continuously and linearly along eight VGB's. Each MaxL line extends linearly for a maximum distance within the array. Such MaxL lines are also referred to as longlines. Each DCL is a non-linear continuum of conductor that is dedicated for broadcasting a signal from a correspondingly dedicated, source VGB to a small cluster of neighboring VGB's. Each FBL is a non-linear conductor continuum that extends about a respective VGB for providing high-speed intra-connections within the VGB proper.

It is within the contemplation of the invention to have other lengths of interconnect lines such as Half-MaxL lines (0.5MaxL lines) which each extends linearly for half of a corresponding maximum distance within the array; and 0.25MaxL lines and so forth. It is also within the contemplation of the invention to have further other lengths of interconnect lines such as 16×L, 32×L, etc., the provision of these being commensurate with the number of VGB's in the FPGA array.

Each VGB (variable grain block) is provided adjacent to at least one HIC or VIC. In one embodiment, four VGB's are wedged together to define respective and mirror-symmetrical four corners of a super-VGB structure (SVGB). See FIG. 2. Each VGB in this SVGB structure is disposed adjacent to one HIC and one VIC of four interconnect channels that surround the SVGB structure in mirror-symmetrical fashion. The SVGB's are arranged as columns and rows. The HIC's and VIC's are also arranged as parallel columns and rows running along the columns and rows of SVGB's.

Figure 2B:
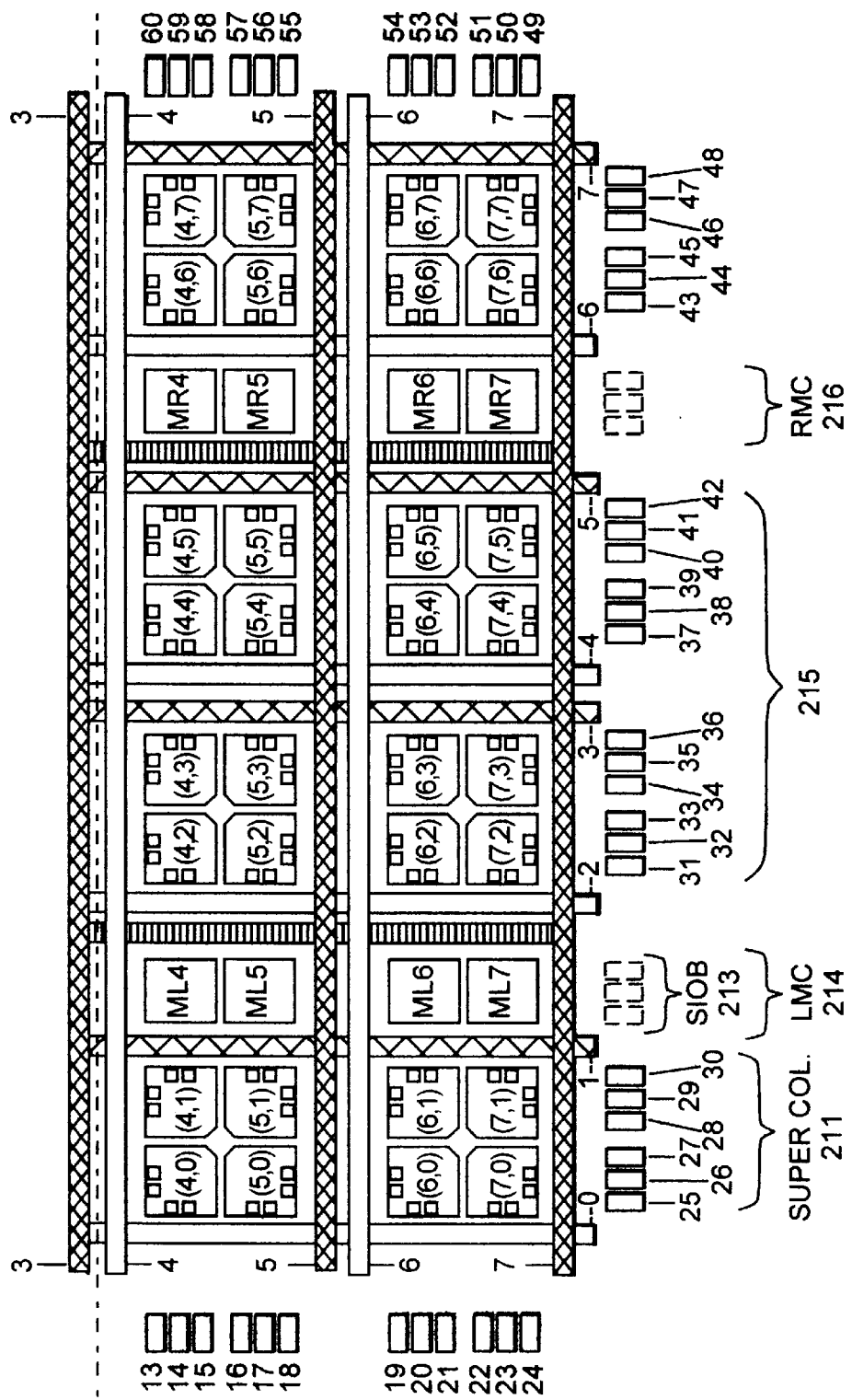
FIG. 2 illustrates an IC device in accordance with the invention having a matrix of SVGB structures, surrounding interconnect channels, and also embedded memory columns.

FIG. 1A shows a first exemplary VGB 110 disposed within a given VGB column K and a second exemplary VGB 120 disposed within a given VGB column K+1. There are two VGB columns (K and K+1) within each SVGB column. Two mirror-symmetrical VIC's 102, 104 brace each SVGB column. FIG. 2 shows a layout at a macroscopic level wherein 211 defines a SVGB column braced by VIC's 0 and 1. More will be said about FIG. 2 below.

Referring still to the more microscopic view of FIG. 1A, a signal acquisition layer 111 of VGB 110 has finger structures such as 112 extending orthogonally over the adjacent interconnect channels, HIC 101 and VIC 102 for acquiring signals from a statically-selected subset of the wires in neighboring HIC and VIC.

The term 'static selection' as used herein refers to selection processes that occurs during a configuring phase of usage of the FPGA device 100. In the configuring phase, configuration memory is programmed to define interconnect routings and logic functions in LUT's (look up tables). When the FPGA device is later used during run-time, statically-made selections such as signal routings cannot be quickly altered. In contrast, 'dynamic selections' can be freely and quickly altered during run-time.

From the view point of VGB 110, each of the individual conductors of the adjacent HIC 101 may be referred to as a Horizontal Adjacent Interconnect Line or 'HAIL'. Some of these HAIL's may extend continuously to other SVGB's (not shown) while others may terminate in the nearby switchboxes area 105. Similarly, each of the individual conductors of the adjacent VIC 102 may be referred to as a Vertical Adjacent Interconnect Line or 'VAIL'. Some of these VAIL's may extend continuously to other SVGB's (not shown) while others may terminate in a nearby switchboxes area.

The acquisition layer 111 of VGB 110 provides input interfacing with its HAIL's and VAIL's. Fingers such as 112 of this acquisition layer each represent one of a limited plurality of static multiplexers that may be configured during configuration-time. The static multiplexers may be used to select from the many diversified HAIL's and VAIL's (56 lines in each channel in the illustrated example), a subset of such conductors from which signals will be supplied to internal processing circuits within VGB_A 110. If the internal processing circuits (X, Z, W, and Y) of VGB_A 110 do not use them, the unused ones of the static multiplexers in acquisition layer 111 may instead supply, one or more feedthrough signals (FTA) to a shared output component (SOC) 150, which component will be further described below.

Similarly, the acquisition layer 121 of VGB 120 (VGB_B) provides input interfacing with its HAIL's and VAIL's. Fingers such as 122 of this acquisition layer each represent one of a limited plurality of static multiplexers that may be configured during configuration-time. The static multiplexers may be used to select from the many diversified HAIL's and VAIL's of VGB_B, a subset of such conductors from which signals will be supplied to VGB_B 120. If the internal processing circuits (X, Z, W, and Y) of VGB_B 120 do not use them, the unused ones of the static multiplexers in acquisition layer 121 may instead supply, one or more feedthrough signals (FTB) to the shared output component (SOC) 150.

For purposes of example, open circles are used in FIG. 1A to provide an indication of which HAIL is statically-selected by each of the acquisition fingers. Each such finger is shown having a corresponding and overlapping open circle within it at the position of its selected HAIL or VAIL. Such internally-hollow circles are also used to represent programmable interconnect points (PIP's). The illustrated open circles within the acquisition fingers of regions 111, 121 may be thought of as the specific PIP's that have been activated for connecting to a specific HAIL or VAIL. The identifications of unique connections to HAIL's or VAIL's in FIG. 1A do not correspond with the identification of lines at the bottom of FIG. 1A as being of different types (2×L, 4×L, etc.). Illustrative liberty was taken to specify two different concepts with the same schematic symbols.

There are a limited number, m, of acquisition fingers (112, 122) of each VGB that cross with a given interconnect channel. In one embodiment, the integer m is at least six but substantially less than the number of HAIL's or VAIL's in the adjacent interconnect channel 101, 102, 104. In one embodiment that has 56 AIL's in each adjacent interconnect channel, each VGB has sixteen fingers crossing with each of its adjacent interconnect channels (8 fingers per CBB). Thus the limited number of m fingers operate to statically bring into the VGB proper (110, 120) a subset of m signals from the greater than m number of adjacent signals in the adjacent channel so that the acquired m signals may be further processed within the VGB 110, 120.

Each VGB contains a set of primitive building blocks known as Configurable Building Elements (CBE's) Each CBE has at least one, statically-configurable lookup table (LUT) with at least 3 address-input terminals. Pairs of CBE's may be synthetically-combined or folded-together to define a higher level building block known as a CBB (Configurable Building Block). In FIG. 1A, element 114 represents one such CBB. See also element 204 of FIG. 2. In one embodiment, there are four CBB's per VGB, respectively named X, Z, W, and Y. Details concerning the folding-together operations of CBE's and concerning the structures of CBB's may be found in at least one of the above-cited patent applications.

Pairs of CBB's may be further combined or folded together to define a yet-higher level building block known as a CBB-duet. In one embodiment, the largest building structure allowed within each VGB is a combination of two CBB-duets to form a CBB-quartet. It is, of course, within the contemplation of the present invention to allow for yet larger combinations of foldings within each VGB if the VGB has more CBB's.

It is therefore seen from the above that each VGB (e.g., 110, 120) car, function both as a signal acquiring resource by virtue of its acquisition fingers 112, 122 and also as a signal processing resource or set of signal processing resources by virtue of its granularly-combinable primitives (CBE's (not shown) and CBB's such as 114).

Output signals of each VGB may be routed through a variety of different output mechanisms (not all shown) for application to different kinds of HAIL's, and VAIL's including, in each channel: a 2×L line, a 4×L line, a 8×L line, a direct connect line (DCL), and a feedback line (FBL). One of the output mechanisms is shown at 150 and is referred to herein as the shared output component (SOC).

SOC 150 includes a first dynamic multiplexer 155h having result signal inputs 151, 152, feedthrough inputs 153, 154, and an output 156. The first dynamic multiplexer (DyMUX) 155h also has a dynamically-controllable select terminal 141 for dynamically selecting a data input signal on one of its inputs such as 151, 152 for output on its output terminal 156. In one embodiment, the DyMUX 155h further has a statically-controlled, second select terminal 142 for switching the mode of operation of DyMUX 155h. In a first mode, control terminal 141 selects as between input terminals 151 (f(A)) and 152 (f(B)). In a second mode, control terminal 141 selects as between input terminals 153 (FTA) and 154 (FTB). Other selection modes are possible for alternative embodiments. Second select terminal 142 is driven by a configuration memory bit 143.

The shared output component (SOC) 150 further includes an OR gate 157 having three data inputs, 158, 161 and 162; and an output 163. OR input terminal 158 is driven by configuration memory cell 159. Input terminal 161 is driven by VGB_A (110). Input terminal 162 is driven by VGB_B (120). OR output 163 drives a dynamically-controllable output-enable (DyOE) terminal of a horizontal longline-driving tristate buffer 160. This horizontal longline driver (H_LLD) 160 is yet another part of SOC 150. Output terminal 165 of H_LLD 160 couples to a MaxL line 101a. This MaxL line 101a is part of HIC 101 and crosses with the acquisition fingers of VGB_A and VGB_B just as do other conductors of HIC 101. However, for purposes of illustrative emphasis, MaxL line 101a is drawn spaced away from the remainder of HIC 101.

In one embodiment, a state-keeper circuit 130 connects to MaxL line 101a. The state-keeper circuit 130 includes first inverter 131, second inverter 133 and resistive element 134. Elements 131, 133 and 134 are programmably-couplable to form a weak latch whose state can be overridden by the output of longline driver (H_LLD) 160. Resistive element 134 may be an integral part of second inverter 133, the former being implemented by using narrow-channel and/or long-channel transistors in the latter. The state-keeper circuit 130 further includes PIP's 132, 135 and 137. The weak latch is programmably-defined by activating PIP's 132 and 135 while leaving PIP 137 in the open state If PIP 137 is instead activated into the closed state together with PIP 135 while PIP 132 is left open, the input of second inverter 133 becomes grounded so as to cause resistive element 134 to weakly urge MaxL line 101a high. This logic '1' state may of course, be overridden by the output of horizontal longline driver (H_LLD) 160. If PIP 135 is left open, the state-keeper circuit 130 has no essentially effect on the state of MaxL line 101a.

State-keeper circuit 130 may be used to maintain a pre-defined logic state on MaxL line 101a during times when DyOE line 163 is deactivated (not enabling tristate buffer 160) and no other tristate buffer is otherwise driving the horizontal MaxL line 101a.

VGB_A (110) can output a dynamically-changing first signal, DyOE_A onto the first OR input terminal 161. VGB_B (120) can output a dynamically-changing second signal, DyOE_B onto the second OR input terminal 162. A logic '1' state on any of OR input terminals, 161, 162 and 158 will of course activate DyOE line 163 and cause H_LLD 160 to transmit the signal of line 156 onto its horizontal MaxL line, 101a.

VGB_A (110) can output a dynamically-changing third signal, DySEL onto the select-controlling first terminal 141 of DyMUX 155h. The DySEL signal is derived from control signals acquired by VGB_A from its surrounding AIL's (adjacent interconnect lines) by way of its acquisition fingers (112).

VGB_A (110) can also output a dynamically-changing fourth signal, f(A) onto the first input terminal 151 of DyMUX 155. The f(A) signal is a processing result signal that may be derived from input-term signals acquired by VGB_A from its surrounding AIL's (adjacent interconnect lines) by way of its acquisition fingers (112). Typically, the f(A) signal is also derived by post-acquisition processing within VGB_A of the acquired input-term signals, where the processing is carried out by any one or more of the CBE (not shown), CBB (114), or other granulatable logic resources of VGB_A. The f(A) signal may also be accompanied by a feed-through signal FTA that is simply acquired by VGB_A and then fed through to SOC 150 without transformation. Details concerning the generation of the f(A) signal as a function of n acquired, input term signals (e.g., f(A)=f(1T), or f(3T), or . . . f(16T)) may be found in at least one of the above-cited patent applications.

Similar to the generation by VGB_A of the f(A) signal, VGB_B (120) can output a dynamically-changing fifth signal, f(B) onto the second input terminal 152 of DyMUX 155h. The f(B) signal is derived from input-term signals acquired by VGB_B from its surrounding AIL's by way of its acquisition fingers (122) As is the case with f(A), the ft(B) signal is typically derived by post-acquisition transformation within VGB_B of its acquired input-term signals, where the transformation or processing is carried out by any one or more of the CBE (not shown), CBB (X, Z, W, and Y), or other granulatable logic resources of VGB_B. The f(B) signal may also be accompanied by a feed-through signal FTB that is simply acquired by VGB_B and then fed through to SOC 150 without transformation.

In FPGA device 100, when mode bit 143 is in an appropriate mode, the DySEL signal 141 can dynamically select one of the f(A) and f(B) signals for output onto line 156 at a desired time. Either of VGB_A 110 or VGB_B 120 can force the DyOE signal 163 to become active (logic '1') by asserting its respective DyOE_A (161) or DyOE_B (162) signal When DyOE signal 163 is activated, the then selected one of the f(A) and f(B) signals is output by H_LLD 160 onto horizontal MaxL line 101a.

Shared output component (SOC) 150 further includes a second dynamic multiplexer 155v having result signal inputs for receiving the f(A) signal (151), the FTA signal (153), a further feedthrough signal FTC from VGB_C (not shown) and a further result signal f(C) from VGB_C (not shown). The second dynamic multiplexer 155v additionally has an output 146. The second dynamic multiplexer (DyMUX)

155ν also has a dynamically-controllable select terminal 144 for dynamically selecting a data input signal on one of its inputs such as f(A) or f(C) for output on its output terminal 146. In one embodiment, the second DyMUX 155ν further has a statically-controlled, second select terminal 145 for switching the mode of operation of second DyMUX 155ν. In a first mode, control terminal 144 selects as between input signals f(A) and f(C). In a second mode, control terminal 144 dynamically selects as between input signals FTA and FTC. Other selection modes are possible for alternative embodiments. Second select terminal 145 is driven by a respective, configuration memory bit (m).

Although not shown, it is to be understood that the output terminal 146 of the second dynamic multiplexer 155ν couples to a 'vertical' longline-driver which is similar to the 'horizontal' LLD 160 except that the V_LLD (not shown, see instead FIG. 1B) drives a vertical MaxL line (not shown) in VIC 102. The DyOE terminal of the not-shown V_LLD is driven by a second OR gate similar to OR gate 157 except that inputs of the second OR gate (not shown) include DyOE_C and DyOE_A. In other words, there is a clockwise-rotating symmetry with respect to which of VGB result signals f(A), f(B), f(C), f(D) and with respect to which of VGB feedthrough signals FTA, FTB, FTC, FTD (not all shown) are programmably-routable for output by a respective, tristate longline-driver (only 160 is shown as an example) to a respective one of the HIC's and VIC's (not all shown) that surround the VGB's _A, _B, _C and _D (not shown, see instead FIG. 1B). For example, a DySEL_C signal obtained from VGB_C drives terminal 144 of the second DyMUX 155ν.

Thus, it is seen that the f(A) result signal produced by VGB_A can be programmably-routed through either one or both of the first and second dynamic multiplexers, 155h and 155ν, for respective output to a corresponding horizontal or vertical MaxL line by way of a corresponding horizontal or vertical longline-driver (LLD), where H_LLD 160 is representative of a horizontal LLD. It is to be understood that each of the remaining VGB result signals, namely, f(B), f(C) and f(D) is similarly, programmably-routable through either one or both of the first and second dynamic multiplexers that serve corresponding horizontal or vertical longline-drivers. Accordingly, during the FPGA configuring process, FPGA configuring software has the possibility of alternatively using one or the other or both of the horizontally-directed and vertically-directed paths for directing each of the VGB result signals, namely, f(A), f(B), f(C) and f(D) to respective, horizontally-extending longlines (such as 101a) and vertically-extending longlines (such as in VIC 102 or 104). This freedom in routing VGB result signals can allow the FPGA configuring software to explore a wider range of partitioning, placement and/or routing options for finding optimized implementations in FPGA 100 of supplied design specifications.

It is further seen from FIG. 1A that VGB_A 110 and VGB_B 120 can share the resources defined by SOC 150 and MaxL line 101a on a time-multiplexed basis. One or more HAIL's (not specifically shown) within HIC 101 may provide coordinating control signals for determining when each of VGB_A 110 and VGB_B 120 has access through DyMUX 155h. One or more HAIL's within HIC 101 or VAIL's within VIC 102 may provide coordinating control signals for determining when the DyOE signal 163 should be asserted. (Configuration memory bit 159 is of course assumed to be held at logic '0' for this situation.) Conversely, VGB_A 110 may take exclusive control of SOC 150 for itself by use of the DySEL signal 141.

Alternatively, VGB_A 110 may grant exclusive control of SOC 150 to VGB_B 120, again by appropriate setting of the DySEL signal 141.

It is further seen from FIG. 1A that signals acquired from either of left VIC 102 or right VIC 104 can be equivalently routed through respective VGB_A 110 or VGB_B 120 to DyMux 155h for equivalent output to horizontal MaxL line 101a. The equivalently routed through signal can be a feedthrough signal or a signal that is processed by the respective and equivalent one of VGB_A 110 and VGB_B 120. This freedom in routing signals from either one of plural interconnect channels (102 or 104) can allow the FPGA configuring software to explore a wider range of partitioning, placement and/or routing options for finding optimized implementations in FPGA 100 of supplied design specifications.

Figure 1B:
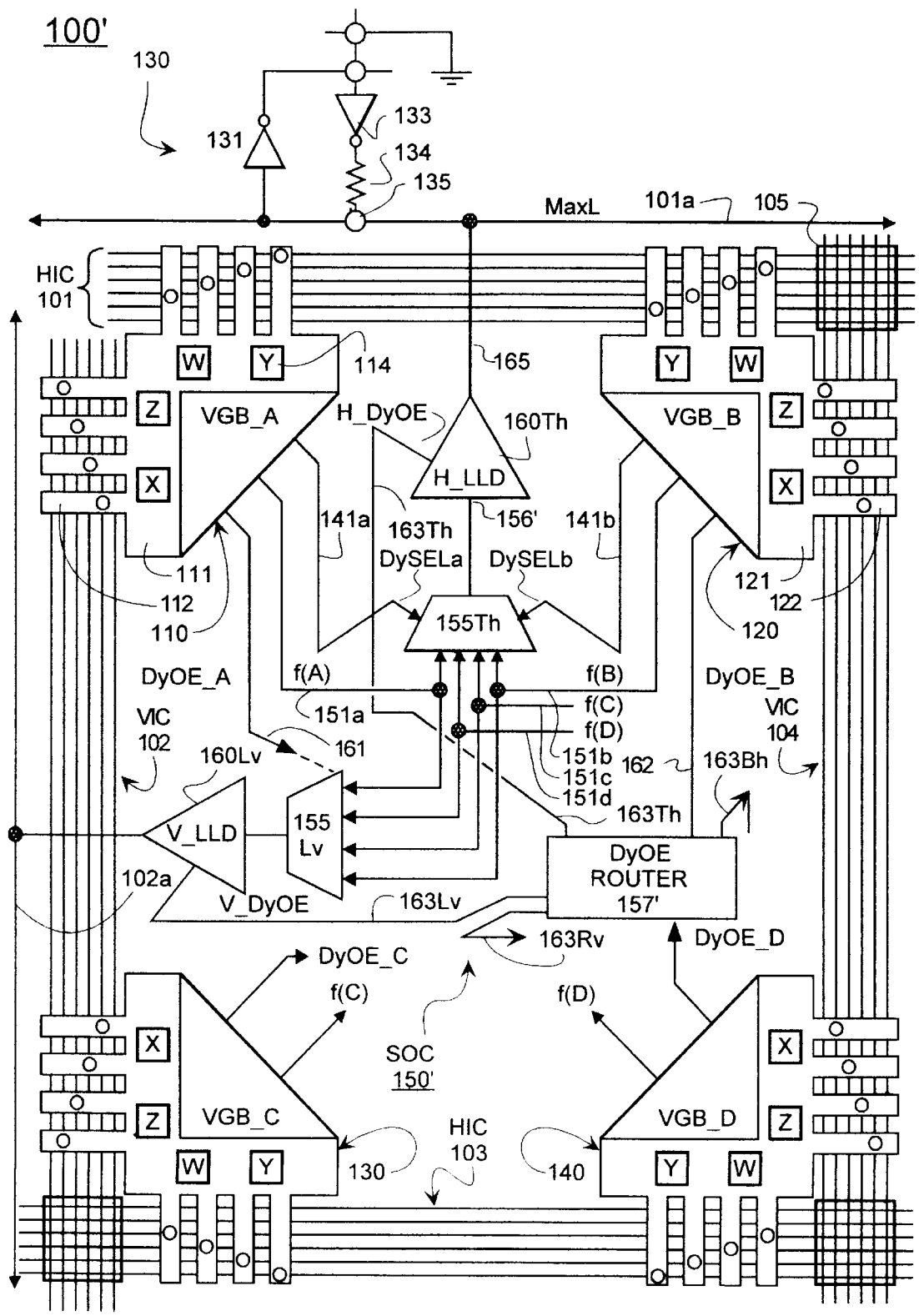
FIG. 1B provides a schematic diagram for explaining how, in a second embodiment, each variable grain block (VGB) has programmably-selectable access to more than two longline-drivers of respectively, orthogonal interconnect channels and how access to each longline driver may be shared by more than two VGB's.

FIG. 1B shows how these concepts may be taken to a next higher level. Where practical, like reference numerals and symbols are used corresponding to those of FIG. 1A. As such a repeat of all is not necessary here. HIC 103 is shown at the bottom of FIG. 1B crossing with VIC's 102 and 104. Switchbox areas like area 105 are shown at the intersections. VGB_C (130) is shown disposed near the intersection of VIC 102 and HIC 103. VGB_D (140) is shown disposed near the intersection of VIC 104 and HIC 103. VGB's 110, 120, 130 and 140 are mirror symmetrical with respect to each other and define parts of an SVGB structure that has SOC 150' disposed near its middle.

In the embodiment 100' of FIG. 1B, first DyMUX 155Th has four input terminals respectively denoted as 151a through 151d for respectively receiving signals f (A), f (B), f (C) and f (D). Here, signals f (A), f (B), f(C) and f(D) each represent one or both of VGB-processing result signals and VGB feedthrough signals respectively supplied from VGB_A (110), VGB_B (120), VGB_C (130), and VGB_D (140). In the case where the inputs to the first DyMUX 155Th represent only the four VGB result signals, DyMUX 155Th may be a 4-to-1 multiplexer. In the case, at the other end of the spectrum, where the inputs to DyMUX 155Th represent eight VGB-sourced signals, the first DyMUX 155Th may be an 8-to-1 multiplexer. Larger versions of DyMUX 155Th are of course contemplated in cases where each VGB sources more than two signals.

The first DyMUX 155Th has at least two, dynamically-controllable select terminals, 141a and 141b, respectively receiving two selection signals, DySELa and DySELb, from respective VGB's 110 and 120. When DySELb is at logic '0', DySELa controls the choice as between f(A) and another of the three remaining f( ) signals, for example, f(C). When DySELa is at logic '0', DySELb controls the choice as between f(B) and another of the three remaining f( ) signals, for example, f(D). In the case where DyMUX 155Th has more than four inputs, additional selection control terminals of one or more of the dynamic and static type may be provided for carrying out the input selection operation. For example, if DyMUX 155Th has eight inputs, each of VGB_A and VGB_B may respectively supply two dynamic selection signals to the DyMux 155Th. In another variation, the four dynamic selection signals may respectively come from one of the four surrounding VGB's 110–140.

DyOE router circuit 157' has at least four inputs respectively receiving dynamic output-enable signals, DyOE_A, DyOE_B, DyOE_C, and DyOE_D from respective VGB's 110, 120, 130 and 140. DyOE router circuit 157' may further include internal configuration memory cells (not shown) for defining how router circuit 157' routes and/or internally processes the received enable signals, DyOE_A–DyOE_D. In one embodiment, router circuit 157' comprises four copies of the combination of OR gate 157 and configuration memory cell 159. Each respective one of the four copies may service a respective one of four control output lines emanating from router circuit 157'. The four control output lines are respectively denoted as 163Th, 163Lv, 163Bh and 163Rv in correspondence with the Top HIC 101, the Left VIC 102, the Bottom HIC 103 and the Right VIC 104. To avoid illustrative clutter, only two of the four, corresponding, tristate longline-drivers (LLD's) are shown, namely, 160Th and 160Lv. V_DyOE signal 163Lv couples to the output-enable terminal of V_LLD 160Lv. H_DyOE signal 163Th couples to the output-enable terminal of H_LLD 160Th.

Vertical longline-driver 160Lv can drive a MaxL line 102a within VIC 102 while horizontal longline-driver 160Th can drive a MaxL line 101a within HIC 101. Although not shown, it is to be understood that another vertical longline-driver (160Rv) is provided for driving a corresponding MaxL line within right VIC 104 and that another horizontal longline-driver (160Bh) is provided for driving a corresponding MaxL line within bottom HIC 103.

A second DyMux 155Lv is further provided in SOC 150' for driving an input of corresponding longline-driver 160Lv. Like the first DyMux 155Th, the second DyMux 155Lv has four input terminals for respectively receiving signals f(A), f(B), f(C) and f(D) respectively from VGB_A (110), VGB_B (120), VGB_C (130), and VGB_D (140). The second DyMUX 155Lv has at least two, dynamically-controllable select terminals (not shown, but corresponding to 141a and 141b), respectively receiving two selection signals, DySELa and DySELc (not shown), from respective VGB's 110 and 130. When DySELc is at logic '0', DySELa controls the choice as between f(A) and another of the three remaining f() signals, for example, f(D). When DySELa is at logic '0', DySELc controls the choice as between f(C) and another of the three remaining f( ) signals, for example, f(B). As with the case of DyMUX 155Th, second DyMUX 155Lv may have more than four inputs and more than the at least two dynamic selection control terminals for selecting among its more than four inputs. DyMUX 155Lv preferably has the same capabilities as first DyMUX 155Th so that a given VGB_A result signal, such as f(A) may be routed by way of line 151a in equivalent manner to either of first DyMUX 155Th and second DyMUX 155Lv.

SOC 150' is further provided with third and fourth DyMux's 155Bh and 155Rv (not shown, but understood to be mirror counterparts of 155Th and 155 Lv). Each of these also has four input terminals for respectively receiving signals f(A), f(B), f(C) and f(D) respectively from VGB_A (110), VGB_B (120), VGB_C (130), and VGB_D (140); and two, dynamically-controllable select terminals (not shown, but corresponding to 141a and 141b).

Thus, it is seen for the embodiment 100' of FIG. 1B that the f(A) result signal produced by VGB_A can be programmably-routed through any one or a subset or all of the first through fourth dynamic multiplexers, 155Th, 155Lv, 155Bh and 155Rv (the last two not shown), for respective output to a corresponding horizontal or vertical MaxL line by way of a corresponding horizontal or vertical longline-driver (LLD). It is to be understood that each of the remaining VGB result signals, namely, f(B), f(C) and f(D) is similarly, programmably-routable through any one or a subset or all of the first through fourth dynamic multiplexers, 155Th, 155Lv, 155Bh and 155Rv that serve corresponding horizontal or vertical longline-drivers. Accordingly, during the FPGA configuring process, FPGA configuring software has the possibility of alternatively using one or the other or both of the horizontally-directed and vertically-directed paths in any of the immediately surrounding interconnect channels (HIC's and VIC's) for directing each of the VGB result signals, namely, f(A), f(B), f(C) and f(D) to respective, horizontally-extending longlines (such as in HIC's 101 and 103) and vertically-extending longlines (such as in VIC's 102 and 104). This freedom in routing VGB result signals can allow the FPGA configuring software to explore a wider range of partitioning, placement and/or routing options for finding optimized implementations in FPGA 100' of supplied design specifications.

It is further seen for the embodiment of FIG. 1B that VGB_A 110 through VGB_D 140 can symmetrically share the resources defined by SOC 150' and the surrounding MaxL lines (e.g., 101a, 102a) on a time-multiplexed basis. One or more HAIL's and/or VAIL's (not specifically shown) may provide coordinating control signals for determining when each of VGB_A 110 through VGB_D 120 has access through respective ones of the four DyMUX's 155Th, 155Lv, 155Bh, 155Rv. One or more HAIL's or VAIL's may provide coordinating control signals for determining when the DyOE signals (163Th, 163Lv, 163Bh, 163Rv) of the respective longline-drivers should be asserted.

Conversely, VGB_A 110 may take exclusive control of DyMux's 160Th and 160Lv for itself if each of VGB_B 120 and VGB_C 130 cooperates by setting its DySELb signal 141b and DySELc signal 141c, to '0'. Then VGB_A may make use of its DySELa signal 141a to control these DyMux's.

FIG. 2 shows a macroscopic view of an FPGA device 200 in accordance with the invention. The illustrated structure is preferably formed as a monolithic integrated circuit.

The macroscopic view of FIG. 2 is to be understood as being taken at a magnification level that is lower than otherwise-provided, microscopic views. The more microscopic views may reveal greater levels of detail which may not be seen in more macroscopic views. And in counter to that, the more macroscopic views may reveal gross architectural features which may not be seen in more microscopic views. It is to be understood that for each more macroscopic view, there can be many alternate microscopic views and that the illustration herein of a sample microscopic view does not limit the possible embodiments of the macroscopically viewed entity.

FPGA device 200 includes a regular matrix of super structures defined herein as super-VGB's (SVGB's). In the illustrated embodiment, a dashed box (upper left corner) circumscribes one such super-VGB structure which is referenced as 201. There are four super-VGB's shown in each super row of FIG. 2 and also four super-VGB's shown in each super column. Each super row or column contains plural rows or columns of VGB's. One super column is identified as an example by the braces at 211. Larger matrices with more super-VGB's per super column and/or super row are of course contemplated. FIG. 2 is merely an example.

As should be apparent from the above discussion, there is a hierarchy of user-configurable resources within each super-VGB. At a next lower level, each super-VGB is seen to contain four VGB's. In the illustrated embodiment, identifier 202 points to one such VGB within SVGB 201.

A VGB is a Variable Grain Block that includes its own hierarchy of user configurable resources. At a next lower level, each VGB is seen to contain four Configurable Building Blocks or CBB's arranged in a L-shaped configuration. In the illustrated embodiment, identifier 204 points to one such CBB within VGB 202.

At a next lower level, each CBB (204) has its own hierarchy of user configurable resources. A more detailed description of the hierarchal resources of the super-VGB's, VGB's, CBB's, and so forth, may be found in the above-cited Ser. No. 08/948,306 filed Oct. 9, 1997 by Om P. Agrawal et al. and originally entitled, "VARIABLE GRAIN ARCHITECTURE FOR FPGA INTEGRATED CIRCUITS", whose disclosure is incorporated herein by reference.

It is sufficient for the present to appreciate that each CBB (204) is capable of producing and storing at least one bit of result data and/or of outputting the result data to adjacent interconnect lines. Each VGB (202) is in turn, therefore capable of producing and outputting at least 4 such result bits at a time to adjacent interconnect lines. This is referred to as nibble-wide processing. Nibble-wide processing may also be carried out by the four CBB's that line the side of each SVGB (e.g., 201).

With respect to the adjacent interconnect lines (AIL's), each SVGB is bounded by two horizontal and two vertical interconnect channels (HIC's and VIC's). An example of a HIC is shown at 250. A sample VIC is shown at 260. Each such interconnect channel contains a diverse set of interconnect lines (e.g., 2×L's–MaxL's) as has already been explained.

The combination of each SVGB (e.g., 201) and its surrounding interconnect resources (of which resources, not all are shown in FIG. 2) is referred to as a matrix tile. Matrix tiles are tiled one to the next as seen, with an exception occurring about the vertical sides of the two central, super columns, 215. Columns 214 (LMC) and 216 (RMC) of embedded memory are provided along the vertical sides of the central pair 215 of super columns. These columns 214, 216 will be examined in closer detail shortly.

From a more generalized perspective, the tiling of the plural tiles creates pairs of adjacent interconnect channels within the core of the device 200. An example of a pair of adjacent interconnect channels is seen at HIC's 1 and 2. The peripheral channels (HIC0, HIC7, VIC0, VIC7) are not so paired. Switch matrix boxes (not shown, see 105 of FIG. 1A) are formed at the intersections at the respective vertical and horizontal interconnect channels. The switch matrix boxes form part of each matrix tile construct that includes a super-VGB at its center.

The left memory column (LMC) 214 is embedded as shown to the left of central columns pair 215. The right memory column (RMC) 216 is further embedded as shown to the right of the central columns pair 215. It is contemplated to have alternate embodiments with greater numbers of such embedded memory columns symmetrically distributed in the FPGA device and connected in accordance with the teachings provided herein for the illustrated pair of columns, 214 and 216.

Within the illustrated LMC 214, a first, special, vertical interconnect channel (SVIC) 264 is provided adjacent to respective, left memory blocks ML0 through ML7. Within the illustrated RMC 264, a second, special, vertical interconnect channel (SVIC) 266 is provided adjacent to respective, right memory blocks MR0 through MR7.

As seen, the memory blocks, ML0–ML7 and MR0–MR7 are numbered in accordance with the VGB row they sit in (or the HIC they are closest to) and are further designated as left or right (L or R) depending on whether they are respectively situated in LMC 214 or RMC 216. In one embodiment, each of memory blocks, ML0–ML7 and MR0–MR7 is organized to store and retrieve an addressable plurality of nibbles, where a nibble contains 4 data bits. More specifically, in one embodiment, each of memory blocks, ML0–ML7 and MR0–MR7 is organized as a group of 32 nibbles (32×4=128 bits) where each nibble is individually addressable by five address bits. The nibble-wise organization of the memory blocks, ML0–ML7 and MR0–MR7 corresponds to the nibble-wise organization of each VGB (202) and/or to the nibble-wise organization of each group of four CBB's that line the side of each SVGB (201). Thus, there is a data-width match between each embedded memory block and each group of four CBB's or VGB. A similar kind of data-width matching also occurs within the diversified resources of the general interconnect mesh. Each of memory blocks ML0–ML7 and MR0–MR7 can output a respective nibble of data onto lines within its immediately adjacent, HIC (e.g., 250).

At the periphery of the FPGA device 200, there are three input/output blocks (IOB's) for each row of VGB's and for each column of VGB's. One such IOB is denoted at 240. The IOB's in the illustrated embodiment are shown numbered from 1 to 96. In one embodiment, there are no IOB's directly above and below the LMC 214 and the RMC 216. In an alternate embodiment, special IOB's such as shown in phantom at 213 are provided at the end of each memory column for driving address and control signals into the corresponding memory column.

Each trio of regular IOB's at the left side (1–24) and the right side (49–72) of the illustrated device 200 may be user-configured to couple to the nearest HIC. Similarly, each trio of regular IOB's on the bottom side (25–48) and top side (73–96) may be user-configured for exchanging input and/or output signals with lines inside the nearest corresponding VIC. The SIOB's (e.g., 213), if present, may be user-configured to exchange signals with the nearest SVIC (e.g., 264).

Irrespective of whether the SIOB's (e.g., 213) are present, data may be input and/or output from points external of the device 200 to/from the embedded memory columns 214, 216 by way of the left side IOB's (1–24) and the right side IOB's (49–72) using longline coupling. The longline coupling allows signals to move with essentially same speed and connectivity options from/to either of the left or right side IOB's (1–24, 49–72) respectively to/from either of the left or right side memory columns.

Data and/or address and/or control signals may also be generated within the FPGA device 200 by its internal VGB's and transmitted to the embedded memory 214, 216 by way of the HIC's and SVIC's 264/266.

The VGB's are numbered according to their column and row positions. Accordingly, VGB(0,0) is in the top left corner of the device 200; VGB(7,7) is in the bottom right corner of the device 200; and VGB(1,1) is in the bottom right corner of SVGB 201.

Each SVGB (201) may have centrally-shared resources. Such centrally-shared resources are represented in FIG. 2 by the diamond-shaped hollow at the center of each illustrated super-VGB (e.g., 201). Longline driving amplifiers (see 160 of FIG. 1A) correspond with these diamond-shaped hollows and have their respective outputs coupling vertically and horizontally to the adjacent HIC's and VIC's of their respective super-VGB's.

As indicated above, each super-VGB in FIG. 2 has four CBB's along each of its four sides. The four CBB's of each such interconnect-adjacent side of each super-VGB can store a corresponding four bits of result data internally so as to define a nibble of data for output onto the adjacent interconnect lines. At the same time, each VGB contains four CBB's of the L-shaped configuration which can acquire and process a nibble's worth of data. One of these processes is nibble-wide addition within each VGB. Another of these processes is implementation of a 4:1 dynamic multiplexer within each CBB. The presentation of CBB's in groups of same number (e.g., 4 per side of a super-VGB and 4 within each VGB) provides for a balanced handling of multi-bit data packets along rows and columns of the FPGA matrix. For example, nibbles may be processed in parallel by one column of CBB's and the results may be efficiently transferred in parallel to an adjacent column of CBB's for further processing. Such nibble-wide handling of data also applies to the embedded memory columns 214/216. Nibble-wide data may be transferred between one or more groups of four CBB's each to a corresponding one or more blocks of embedded memory (MLx or MRx) by way of sets of 4 equally-long lines in a nearby HIC. Each such set of 4 equally-long lines may be constituted by the double-length lines (2×L lines), quad-length lines (4×L lines), octal-length lines (8×L lines) or maximum length longlines (MaxL lines).

In one particular embodiment of the FPGA device, the basic matrix is 10-by-10 SVGB's, with embedded memory columns 214/216 positioned around the central two super columns 215. (See FIG. 2.) In that particular embodiment, the integrated circuit is formed on a semiconductor die having an area of about 120,000 mils$^2$ or less. The integrated circuit includes at least five metal layers for forming interconnect. So-called 'direct connect' lines and 'longlines' of the interconnect are preferably implemented entirely by the metal layers so as to provide for low resistance pathways and thus relatively small RC time constants on such interconnect lines. Logic-implementing transistors of the integrated circuit have channel lengths of 0.35 microns or 0.25 microns or less. Amplifier output transistors and transistors used for interfacing the device to external signals may be larger, however.

As indicated above, each VGB may contain nibble-wide drive capabilities FIG. 3A shows one embodiment 300 wherein there are sixteen (16) shared big drivers (MaxL drivers) in the shared core of each SVGB for providing nibble-wide coupling to MaxL interconnect lines of each of the four respectively adjacent HIC's and VIC's. The connections shown in FIG. 3A are for the case of super-VGB (0,0) of embodiment 300. This super-VGB is surrounded by horizontal interconnect channels (HIC's) 0 and 1 and by vertical interconnect channels (VIC's) 0 and 1. The encompassed VGB's 310, 320, 330 and 340 are respectively enumerated as A=(0,0), B=(0,1), C=(1,0) and D=(1,1). The shared output components (SOC's) section of this SVGB is shown at 350. SOC's section 350 controls sixteen tristateable longline-drivers (LLD's) that are respectively identified according to the channel they service as: N1 through N4, E1 through E4, S1 through S4, and W1 through W4. Angled line 315 represents the supplying of generically-identified signals: DyOE, Yz, Wz, Xz, Zz, FTY(1,2) and FTX(1,2) to SOC's section 350 from VGB_A (310). Thus it is seen that each of the Y, W, X, and Z CBB's of VGB_A can supply a respective function signal, Yz, Wz, Xz, and Zz for output by a tristate longline-driver. VGB_A also supplies a respective, dynamic output-enable signal, DyOE_A. VGB_A also supplies four respective feed-through signals, FTY(1), FTY(2), FTX(1) and FTX(2) from its acquisition fingers (not shown).

Angled lines 325, 335, and 345 similarly and respectively represent the supplying of the above generically-identified signals to block 350 from VGB_B, VGB_C and VGB_D.

The adjacent MaxL interconnect lines are subdivided in each HIC or VIC into four groups of 4 MaxL lines each. These groups are respectively named MaxL0, MaxL1, MaxL2 and MaxL3 as one moves radially out from the core of the super-VGB. AIL numbers are assigned to respective lines. MaxL drivers N1 through N4 respectively connect to the line that is closest to the core in each of respective groups MaxL0, MaxL1, MaxL2 and MaxL3 of the adjacent north HIC. MaxL drivers E1 through E4 similarly and respectively connect to the closest to the core ones of MaxL lines in respective groups MaxL0–MaxL3 of the adjacent east VIC. MaxL drivers S1 through S4 similarly and respectively connect to the closest to the core ones of MaxL lines in respective groups MaxL0–MaxL3 of the adjacent south HIC. MaxL drivers W1 through W4 similarly and respectively connect to the closest to the core ones of MaxL lines in respective groups MaxL0–MaxL3 of the adjacent west vertical interconnect channel (VIC(0)).

As one steps right in the FPGA device 300 to a next super-VGB (not shown), the N1–N4 connections move up by one line in each of the respective groups MaxL0–MaxL3, until the move where the top most line is reached in each group. Then, in the next such move, the connections wrap around to the bottom most line for the next super-VGB to the right and the scheme repeats.

A similarly changing pattern applies for the southern drives. As one steps right to a next super-VGB (not shown), the S1–S4 connections move down by one line in each of the respective groups MaxL0–MaxL3, until the bottom most line is reached in each group, and then the connections wrap around to the top most line for the next super-VGB to the right and the scheme repeats.

A similarly changing pattern applies for the eastern and western drives. As one steps down to a next super-VGB (not shown), the E1–E4 and W1–W4 connections move outwardly by one line in each of the respective groups MaxL0–MaxL3, until the outer most line is reached in each group, and then the connections wrap around to the inner most line of each group for the next super-VGB down and the scheme repeats.

Figure 3B:
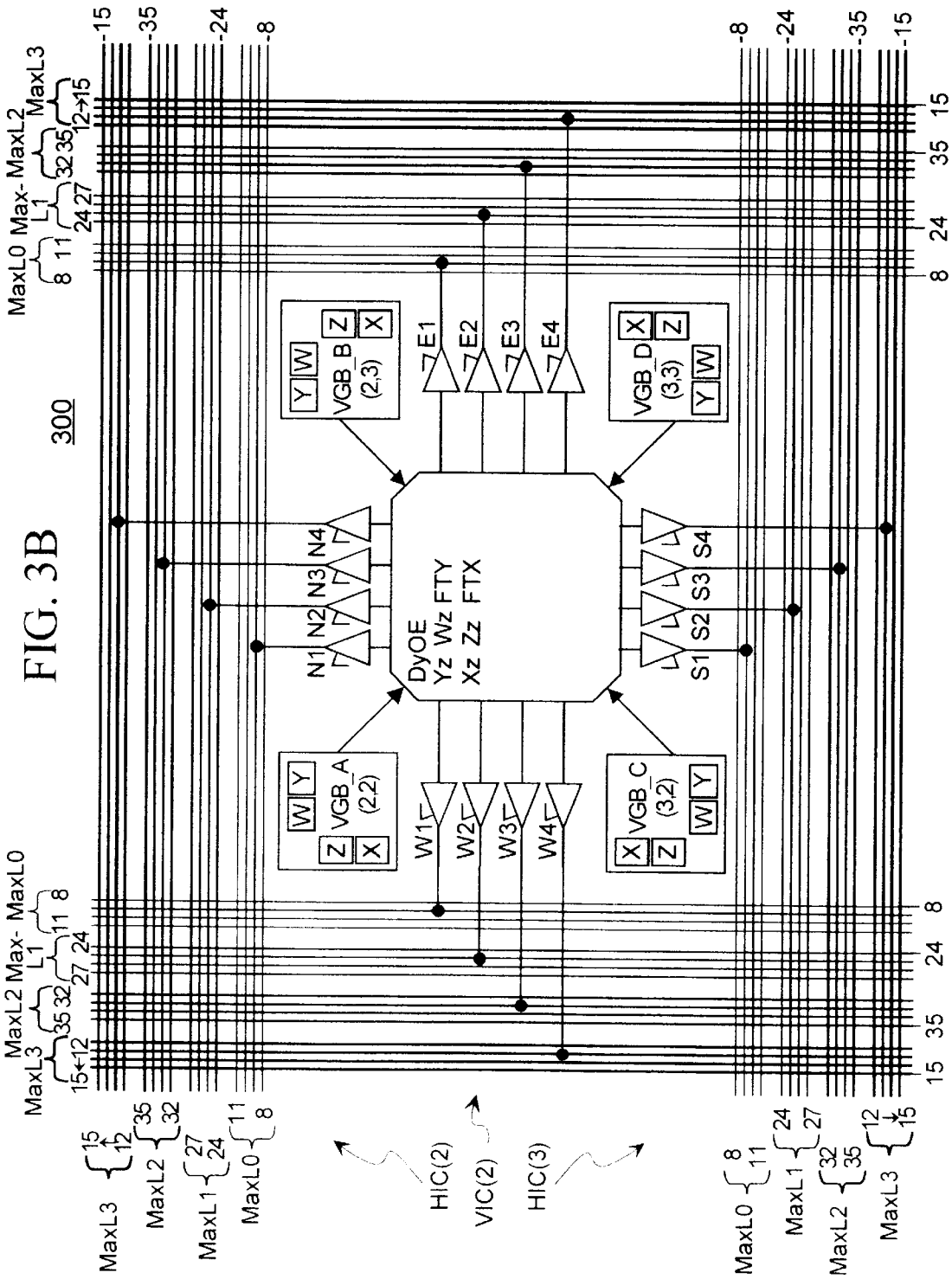

FIG. 3B shows a sampling of this out-stepping pattern of connections for the super-VGB surrounded by HIC's 2 and 3 and by VIC's 2 and 3. The encompassed VGB's are enumerated as A=(2,2), B=(2,3), C=(3,2) and D=(3,3).

Figure 3C:
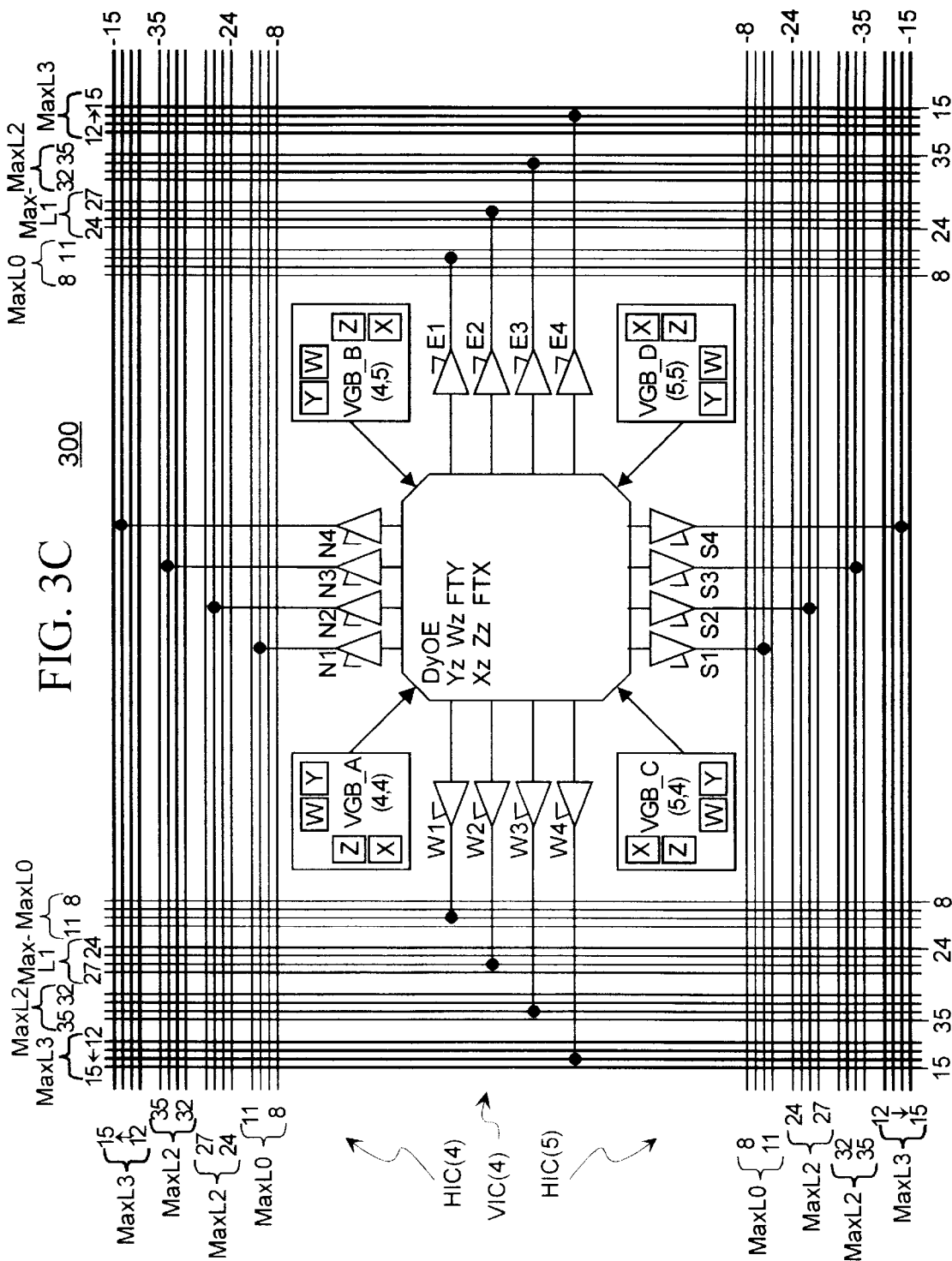

FIG. 3C shows a sampling of this out-stepping pattern of connections for the next super-VGB along the diagonal, which super-VGB is surrounded by HIC's 4 and 5 and by VIC's 4 and 5. The encompassed VGB's are enumerated as A=(4,4), B=(4,5), C=(5,4) and D=(5,5).

Figure 3D:
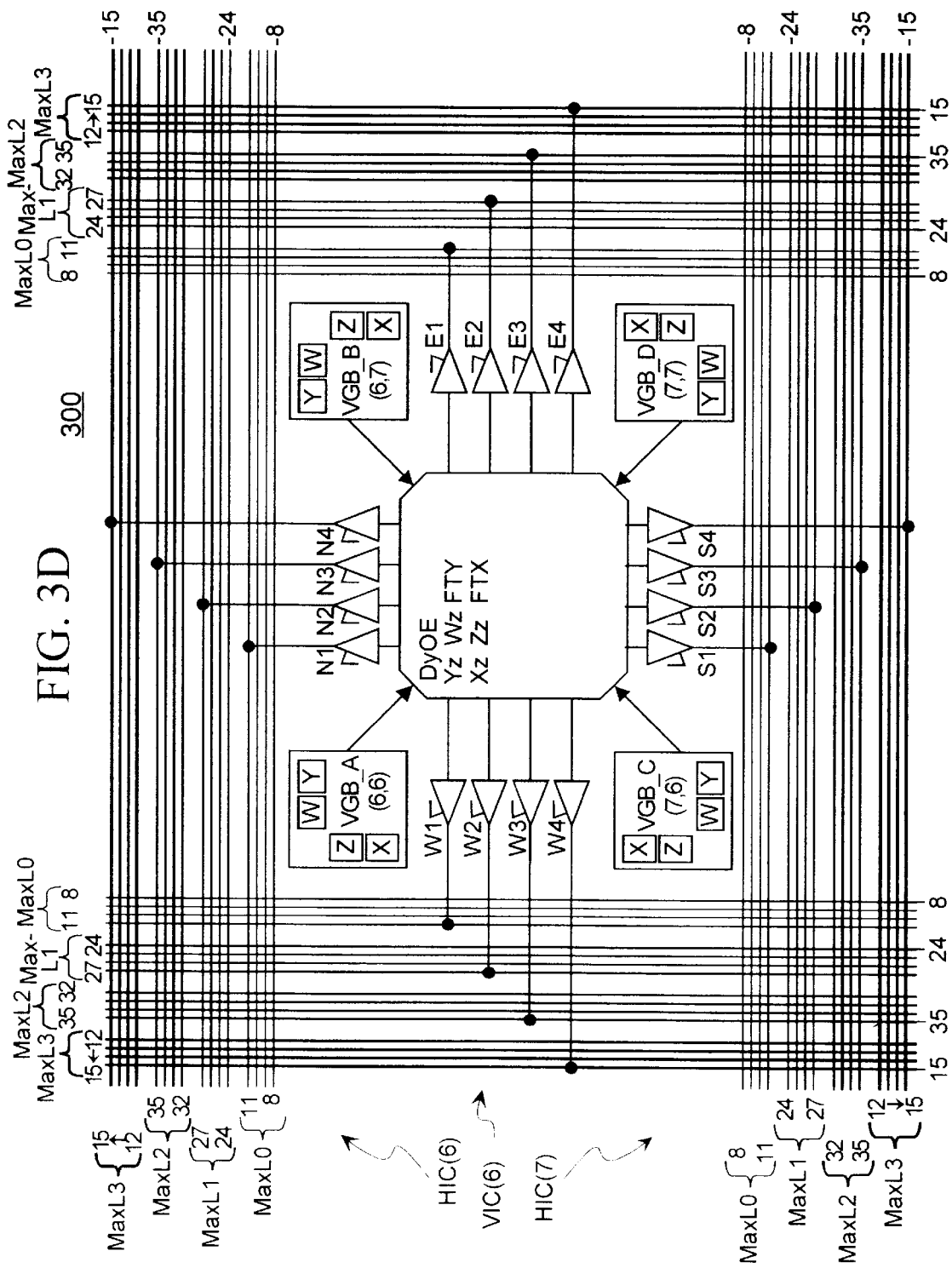

FIG. 3D shows a sampling of this out-stepping pattern of connections for the next super-VGB along the diagonal, which super-VGB is surrounded by HIC's 6 and 7 and by VIC's 6 and 7. The encompassed VGB's are enumerated as A=(6,6), B=(6,7), C=(7,6) and D=(7,7).

The combination of FIGS. 3A–3D demonstrates how all 16 MaxL lines of a given HIC can be driven by the northern or southern MaxL drivers of a horizontal succession of four super-VGB's. The combination of FIGS. 3A–3D also demonstrates how all 16 MaxL lines of given VIC can be driven by the eastern or western MaxL drivers of a vertical succession of four super-VGB's. Bus-wide operations can be supported for nibble-wide buses by just one super-VGB acting as the bus driver. Bus-wide operations can be supported for byte-wide buses by a pair of super-VGB's acting as bus master. Bus-wide operations can be supported for 16bit-wide buses by a quadruple of super-VGB's acting as bus master. For wider buses, the driving super-VGB's can be configured to behave as dynamic multiplexers that provide time-multiplexed sharing of the adjacent MaxL lines. For example, each of the X, Z, W, and/or Y CBB's of each longline-driving super-VGB can be configured as a 4:1 multiplexer. The CSE output signals Xz, Zz, Wz, and/or Yz of these CBB's can then drive the shared big drives to provide neighboring VGB's with time shared access to the driven longlines of the respective, longline-driving super-VGB.

In cases where it is desirable for both VGB_A and VGB_B to drive their respective 1 to 4 bits of output data (Xz, Zz, Wz, and/or Yz) through a same quartet of longline-drivers (N1, N2, N3, N4 for example), the configuration scheme of FIG. 1A may be used. In cases where it is desirable for three or more of VGB_A, VGB_B, VGB_C and VGB_D to drive their respective 1 to 4 bits of output data (Xz, Zz, Wz, and/or Yz) through a same quartet of longline-drivers (N1, N2, N3, N4 for example), the configuration scheme of FIG. 1B may be used.

Note that there is a same number (e.g., 16) of MaxL drivers as there are CBB's (X,Z,W,Y times 4) within each super-VGB in the embodiment 300 of FIGS. 3A–3D. A particular, coarsely-granulated configuration of the FPGA device 300 may call for each CBB to consume a corresponding MaxL driver. This would make full efficient use of the MaxL driving resources of the super-VGB.

On the other hand, an alternate, more finely-granulated configuration of the FPGA device 300 may call for a larger number of CBE's (more-finely granulated, Configurable Building Elements, not shown) in a first super-VGB to each drive a corresponding MaxL driver. This would exceed the longline driving capabilities of the first super-VGB. However, it may be in the alternate configuration that there are an adjacent one or more other super-VGB's whose MaxL drivers are not fully consumed and are accessible via the feedthrough lines (FTX, FTY) to the CBE's of the first super-VGB. In such a case, the excess CBE's of the first super-VGB can make efficient use of unconsumed MaxL drivers in the neighboring super-VGB's.

It is therefore seen that the use of shared high-powered drive amplifiers for supporting the high-powered drive needs of a larger number of CBE's (instead of using dedicated high-powered drive amplifiers on a one per CBE basis), means that the amount of integrated circuit space consumed on a per CBE basis (or even on a per VGB basis) is reduced. At the same time, the central sharing approach of each super-VGB increases the likelihood that each high-powered amplifier will be used by one of the multiple CBE's, CBB's or VGB's in the super-VGB or in a neighboring super-VGB. This is more efficient than having the large area of a given high-powered amplifier wasted because no CBE, CBB or VGB uses that high-powered amplifier.

The combination of FIGS. 3A–3D is also intended to demonstrate how result signals may be configurably routed to the longlines (MaxL lines) of either one of orthogonal interconnect channels, or alternatively, simultaneously broadcast to the longlines of such orthogonal interconnect channels. One embodiment of SOC's section 350 allows for such omni-directional routings.

Figure 4A:
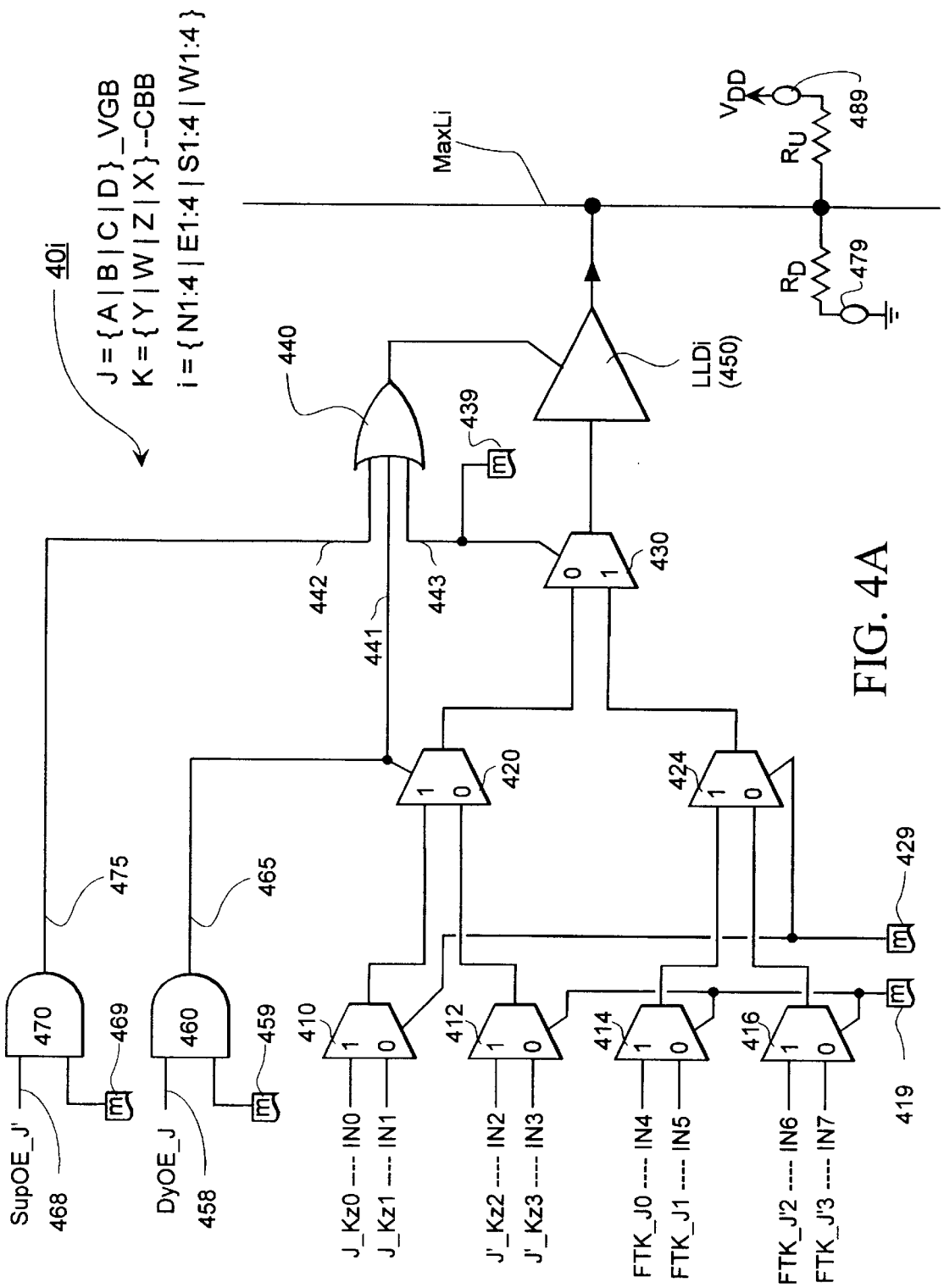
FIG. 4A is a schematic of shared, big drive logic for each MaxL line driver of a given super-VGB.

FIGS. 4A–4C illustrate a number of possible designs for the SOC's section 350 of FIG. 3A.

FIG. 4A is a schematic diagram of one SOC (Shared output components) circuit 40i that interfaces with longline-driver (LLD) number i. The integer i may be any value of 1 through M, where M represents the respective plurality of M MaxL line drivers in the shared core 350 (FIG. 3A) of each super-VGB. As already explained, in one embodiment, M=16. These 16 drivers are uniformly distributed as: (a) 4 northern MaxL line drivers for driving a respective 4 northern MaxL lines adjacent to the super-VGB; (b) 4 eastern MaxL line drivers for a respective 4 eastern, adjacent MaxL lines; (c) 4 southern MaxL line drivers for a respective 4 southern, adjacent MaxL lines; and (d) 4 western MaxL line drivers for a respective 4 western, adjacent MaxL lines.

In FIG. 4A, each of the symbols J or J' may represent a respective one of the _A, _B, _C and _D VGB's of a given super-VGB. K designates one of the X, Z, W, and Y CBB's. FTK designates a feedthrough signal from a respective CBB. FIG. 4B provides a matrix showing a mix used in one embodiment. Other mixes are of course also possible. The respective inputs of static multiplexers 410–416 are named as IN0 through IN7, or alternatively as J_Kz0 through J'_Kz3 and as FTK_J0 through FTK_J'3 as shown.

Multiplexers 410 and 414 form a shared logic section (580 in FIG. 5) associated with first VGB J while multiplexers 412 and 416 form the shared logic section (580') associated with second VGB J'. Dynamic multiplexer 420 and static multiplexer 424 are arranged outside of first and second VGB's J and J' since these multiplexers 420, 424 collect signals from both of VGB's J and J'.

Multiplexer 420 may be used to dynamically select between the configuration-defined output of either static multiplexer 410 or of static multiplexer 412. Configuration memory bit 419 drives the selection control terminal of multiplexer 412 as well as those of multiplexers 414 and 416. Configuration memory bit 429 drives the selection control terminal of static multiplexer 410 as well as that of multiplexer 424. The selection control terminal of dynamic multiplexer 420 is driven by AND gate 460. One input of AND gate 460 is driven by configuration memory bit 459. Another input of AND gate 460 is driven by the DyOE_J signal on line 458. This DyOE_J signal is a common-controls derived signal such as 558 of FIG. 5. Given that multiplexer 410 obtains a CBB output signal from a first VGB, J and that multiplexer 420 obtains a CBB output signal from a second VGB, J', when configuration memory bit 459 is at logic '1', the DyOE_J signal (458) passes through onto line 465 and as such may be used to dynamically select an output from one of VGB's J and J' as an input for longline driver LLDi (450). When line 465 is high (logic '1'), the output of multiplexer 410 is selected. When line 465 is low (logic '0'), the output of multiplexer 412 is selected. This is indicated by the placement of the '1' and '0' symbols at the data inputs of dynamic multiplexer 420. Such symbolism is used throughout. As such, the basic operations of configuration memory bits 419, 429, 439, 459 and 469 are understood from the schematic. As will be further understood, configuration memory bit 439 should be set low, while bit 469 and line 468 may should be set high when it is desired to use line 458 as a dynamic selection control.

When configuration memory bit 439 is set high, the correspondingly-controlled multiplexer 430 passes through one of the feedthrough signals (IN4 through IN7) selected by static multiplexers 414, 416 and 424. The high on bit 439 also passes in this condition through input 443 of OR gate 440 to fixedly activate the output enable (OE) terminal of three-state longline driver 450. Signals on lines 441 and 442 of the OR gate become don't-cares under this condition.

If bit 439 is set low (logic '0'), a high on one of OR gate inputs 441 and 442 may alternatively pass through OR gate 440 to activate the OE terminal of tri-state driver 450. If all of configuration memory bits 439, 459 and 469 are set low, the tri-state driver 450 (LLDi) is disabled and placed in a high output impedance state (High Z). In one embodiment, the output stage of tri-state driver 450 features PMOS output transistors with channel widths of approximately 35 microns and NMOS output transistors with channel widths of approximately 15 microns.

Input line 468 of AND gate 470 represents an alternate or supplemental output enable. Like line 458, line 468 connects to one of the DYOE signals developed within the common control sections of the super-VGB (580 of FIG. 5). If configuration memory bit 469 is set high while each of bits 459 and 439 is low, the output of multiplexer 412 passes through multiplexers 420 and 430 to become the input of longline driver 450. The SupOE_J' signal of line 468 may act at the same time as a dynamic output enable that activates and deactivates tri-state driver 450 at desired times.

If configuration memory bit 459 is set high while each of bits 469 and 439 is low, output 465 functions as both a dynamic output enable for tri-state driver 450 and as a selector on multiplexer 420. Obviously, the '0' input of static means 420 is a don't-care in this situation because LLDi 450 is disabled when line 465 goes low under this situation and by happenstance selects the '0' input of multiplexer 420.

In one embodiment, one or more of the MaxL lines may be configurably connectable to a weak pull-up resistor $R_U$ and/or to a weak pull-down resistor $R_D$ via respective PIP's 479 and/or 489 as shown. Those skilled in the art will appreciate that narrow-channel pass-transistors of appropriate P or N type may be used to integrally implement both the resistive portion and the PIP portion of these line urging means 479 and/or 489. When PIP 489 is activated to resistively connect the MaxLi line to pull-up voltage VDD, a wired-AND gate may be implemented on the MaxLi line if each line driver LLDi of that line has a zero at its input and the corresponding OE terminal of each such line driver LLDi receives an input signal of the wired-AND gate, for example, from line 475. In the latter case, the SupOE_J' signal of line 475 may be derived from a complex function signal that has been placed on an AIL of the super-VGB and has been acquired by an acquisition fingers of that VGB. As such, wired-ANDing of a plurality of complex function signals may be realized along the MaxLi line when desired.

Conversely, when PIP 479 is activated to resistively connect the MaxLi line to ground (logic '0'), a wired-OR gate may be implemented on the MaxLi line if each line driver LLDi of that line has a logic one at its input and the corresponding OE terminal of each such line driver LLDi receives an input signal of the wired-OR gate, for example, from line 475.

In an alternate embodiment, no pull-ups or pull-downs are provided on the MaxLi lines within the core of the FPGA. Instead, configuration-activatable, weak pull-up resistors ($R_U$) are provided only on a selected subset of longlines (4 lines in each VIC or HIC) within the peripheral interconnect channels. These peripheral NOR lines may be driven by adjacent IOB's and/or by the longline drivers of immediately adjacent super-VGB's to implement wide-input NOR functions.

In yet another alternate embodiment, keeper circuits such as 130 of FIG. A are employed on all or a select subset of the longlines.

Referring to the configurations matrix of FIG. 4B, note that the northern MaxL drivers N1:4 (N1 through N4) acquire their DyOE_J and SupOE_J' signals respectively from the northern VGB's _A and _B. Similarly, the eastern drivers E1:4 acquire their DyOE signals from eastern VGB's _B and _D; the southern drivers S1:4 acquire their DyOE signals from southern VGB's _D and _C; and the western drivers W1:4 acquire their DyOE signals from western VGB's _C and _A.

In similar vein, for the northern MaxL drivers N1:4, the IN0–IN3 signals are acquired respectively from the northern VGB's _B and _A. For drivers N1 and N3, dynamic selection is possible between the Y and X CBB's of VGB's _B and _A. For drivers N2 and N4, dynamic selection is possible between the Z and W CBB's. A corresponding pattern is shown for the other drivers, E1:4, S1:4 and W1:4.

Additionally, for the northern MaxL drivers N1:4, the IN4–IN7 feedthrough signals are acquired respectively from the FTX1 and FTX2 lines of northern VGB's _B and _A. A corresponding pattern is shown for the other drivers, E1:4, S1:4 and W1:4.

Note that same source signals are seen multiple times in the matrix of FIG. 4B. For example, the A_Yz CSE output signal may be routed to any one or all of the following tri-state drivers: N1, N3, W1 and W4. The FTX1_A feedthrough signal may be routed to any one or all of the following tri-state drivers: N1, N2, N3 and N4. The below Table-1 and Table-2 show the respective routing options for the CBB outputs and the feedthroughs.

TABLE 1

| VGB_CBB Output Source | Dest1 | Dest2 | Dest3 | Dest4 |
|---|---|---|---|---|
| A_Xz | N1 | N4 | W1 | W3 |
| A_Yz | N1 | N3 | W1 | W4 |
| A_Wz | N2 | N4 | W2 | W3 |
| A_Zz | N2 | N3 | W2 | W4 |
| B_Xz | N1 | N4 | E1 | E3 |
| B_Yz | N1 | N3 | E1 | E4 |
| B_Wz | N2 | N4 | E2 | E3 |
| B_Zz | N2 | N3 | E2 | E4 |
| C_Xz | S1 | S4 | W1 | W3 |
| C_Yz | S1 | S3 | W1 | W4 |
| C_Wz | S2 | S4 | W2 | W3 |
| C_Zz | S2 | S3 | W2 | W4 |
| D_Xz | S1 | S4 | E1 | E3 |
| D_Yz | S1 | S3 | E1 | E4 |
| D_Wz | S2 | S4 | E2 | E3 |
| D_Zz | S2 | S3 | E2 | E4 |

Note from the above Table-1 that a nibble's-worth of data may be output from a given VGB through four, same-directed MaxL drivers to the adjacent MaxL lines. For example, CBB outputs: A_Xz, A_Yz, A_Wz, and A_Zz, may be simultaneously and respectively routed to: N1, N3, N4 and N2. Alternatively, CSE outputs: A_Xz, A_Yz, A_Wz, and A_Zz, may be simultaneously and respectively routed to: W3, W1, W2 and W4.

TABLE 2

| Feedthrough Source | Dest1 | Dest2 | Dest3 | Dest4 |
|---|---|---|---|---|
| FTX1_A | N1 | N2 | N3 | N4 |
| FTX2_A | N1 | N2 | N3 | N4 |
| FTY1_A | W1 | W2 | W3 | W4 |
| FTY2_A | W1 | W2 | W3 | W4 |
| FTX1_B | N1 | N2 | N3 | N4 |
| FTX2_B | N1 | N2 | N3 | N4 |
| FTY1_B | E1 | E2 | E3 | E4 |

TABLE 2-continued

| Feedthrough Source | Dest1 | Dest2 | Dest3 | Dest4 |
|---|---|---|---|---|
| FTY2_B | E1 | E2 | E3 | E4 |
| FTX1_C | S1 | S2 | S3 | S4 |
| FTX2_C | S1 | S2 | S3 | S4 |
| FTY1_C | W1 | W2 | W3 | W4 |
| FTY2_C | W1 | W2 | W3 | W4 |
| FTX1_D | S1 | S2 | S3 | S4 |
| FTX2_D | S1 | S2 | S3 | S4 |
| FTY1_D | E1 | E2 | E3 | E4 |
| FTY2_D | E1 | E2 | E3 | E4 |

Note from the above Table-2 that a nibble's-worth of data may be fedthrough from parallel legs of a given pair of adjacent VGB's through four, same-directed MaxL drivers to the adjacent MaxL lines. For example; feed-through outputs: FTX1_A, FTX2_A, FTX1_B and FTX2_B, may be simultaneously and respectively routed to: N1, N2, N3 and N4. Alternatively, feedthrough outputs: FTY1_A, FTY2_A, FTY1_C and FTY2_C may be simultaneously and respectively routed to: W1, W2, W3 and W4.

FIG. 4C is a schematic diagram of an alternate design for each SOC circuit 170i' where i' equals 1 through M for the respective plurality of M MaxL line drivers in the shared core 350 (FIG. 3A) of each super-VGB. Like reference numerals in the '400' century series are used in FIG. 4C for elements having like counterparts in FIG. 4A. As such, the functions of most of the like-numbered elements will be understood by implication.

A major difference in the alternate SOC circuit 170i' of FIG. 4C is that dynamic selection is carried one level deeper to produce signal $f_{A-D}(8T)$ at the output of dynamic multiplexer 420c, where signal $f_{A-D}(8T)$ can be any function of as many as 8 independent input terms. In essence, the function synthesis capabilities of all four VGB's (_A through _D) of the encompassing super-VGB are being folded together in the alternate shared logic circuit 170i'.

To produce the $f_{A-D}(8T)$ signal, each of multiplexers 410', 412', 414' and 416' receives Kz signals from respective ones of VGB's _A through _D and statically selects a subset of the supplied Kz signals. Multiplexer 410' produces a first 6-term (or wide-output) signal, $f_A(6T/WO)$ which was synthesized in VGB_A. Multiplexer 412' produces a second 6-term (or wide-output) signal, $f_B(6T/WO)$ which was synthesized in VGB_B. Multiplexer 414' produces a third 6-term (or wide-output) signal, $f_C(6T/WO)$ which was synthesized in VGB_C. Multiplexer 416' produces a fourth 6-term (or wide-output) signal, $f_D(6T/WO)$ which was synthesized in VGB_D.

Multiplexer 420a dynamically selects between $f_A(6T/WO)$ and $f_B(6T/WO)$ in response to selection control signal 441' which may be developed from DyOE_J1 by AND gate 460a. In similar fashion, multiplexer 420b dynamically selects between $f_C(6T/WO)$ and $f_D(6T/WO)$ in response to selection control signal 441' (or in yet a further alternative embodiment, in response to a different selection control signal which is derived from another DyOE signal supplied by a VGB). The outputs of dynamic multiplexers 420a and 420b are therefore respectively denoted as f__AB(7T) and f__CD(7T) to indicate they can be any function of up to 7 independent input terms.

Multiplexer 420c dynamically selects between f__AB(7T) and f__CD(7T) in response to selection control signal 444' which is developed from DyOE_J2 by AND gate 460b.

DyOE_J1 can be produced by the common controls section (580) of one VGB while DyOE_J2 can be simultaneously produced by the common controls section of a second VGB. Signal SupOE_J' (468') may be simultaneously produced by the common controls section of a third VGB of the same super-VGB. The choice of which VGB produces which of signals DyOE_J1, DyOE_J2 and SupOE_J' can vary.

As is further seen in FIG. 4C, multiplexer 430' statically selects either the $f_{A-D}(8T)$ output signal of multiplexer 420c or a feedthrough signal that is statically selected by, and provided by, multiplexer 424'. The output of multiplexer 430' is coupled to the input of tristate driver 450'. Although not shown, it is understood that multiplexer 424' is coupled to receive respective feedthrough signals (FTX and/or FTY) from each of VGB's _A through _D and to statically select one of those feedthrough signals in accordance with configuration data stored in the FPGA device's configuration memory at 449'.

The dynamically multiplexing capabilities of multiplexers 420a, 420b and 420c may be used to dynamically multiplex respective output signals $f_A(\ )$, $f_B(\ )$, $f_C(\ )$, and $f_D(\ )$ of a respective four different VGB's (e.g., J=A, J'=B, J"=C and J'"=D) through LLDi 450' at different times. The SupOE_J' signal (468') may be used to activate the OE terminal of LLDi 450' when DyOE_J1 (458) is at logic '0' (and configuration memory bit is also '0').

Figure 5:
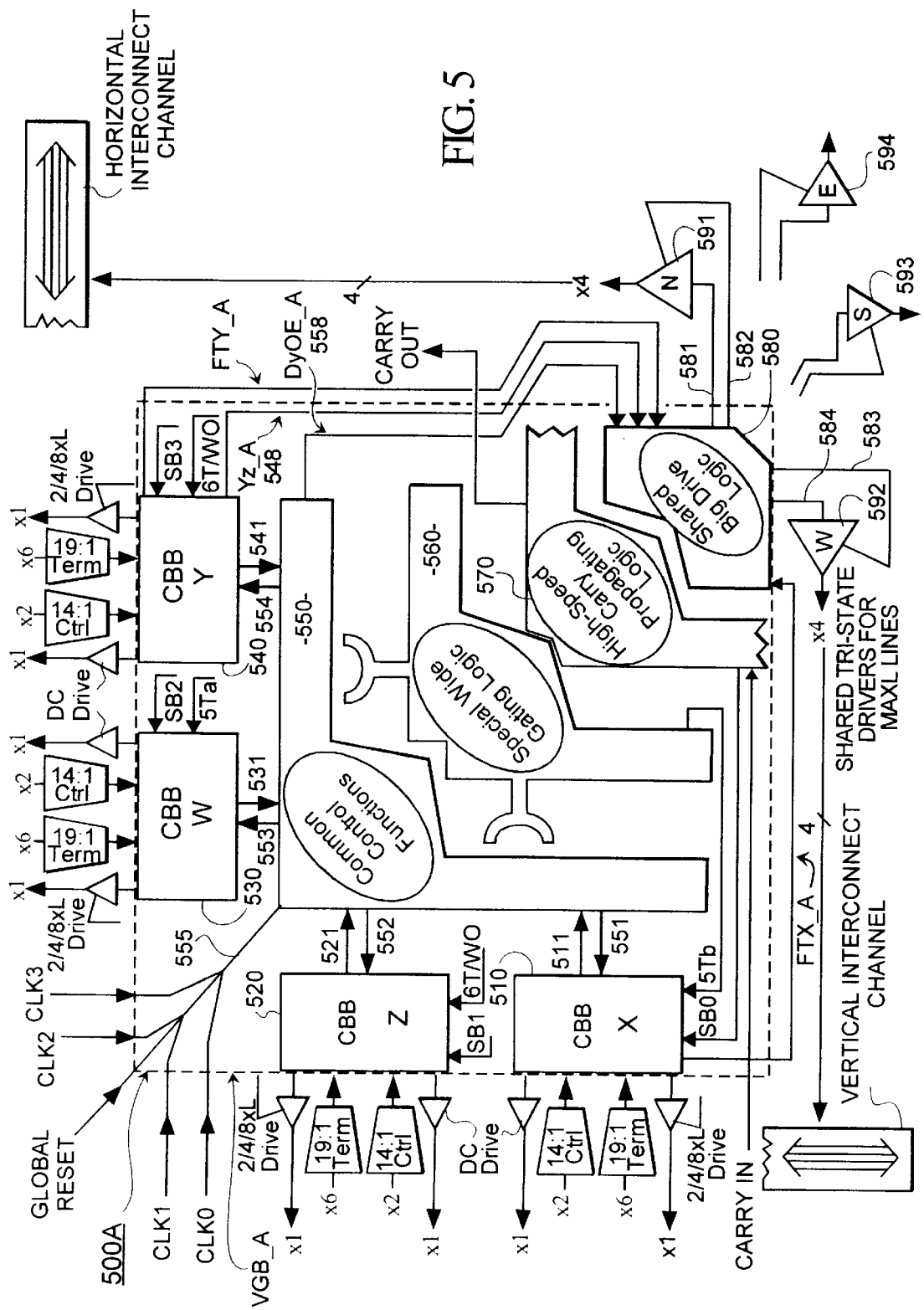
FIG. 5 illustrates an embodiment of one quadrant of a SVGB structure.

FIG. 5 shows various details within a SVGB quadrant in accordance with the invention. This quadrant includes Variable Grain Block 500A (also referred to as VGB_A) that is further in accordance with the present invention. VGB_A (500A) is shown in FIG. 5 at a more microscopic viewing level than that of FIG. 1B. It is understood that the other VGB's, namely, _B, _C and _D of each super-VGB have similar resources arranged in respective mirror-opposed symmetry with those of the illustrated VGB_A. It is also understood that other schemes for forming a VGB are possible.

The common controls developing section 550 of FIG. 5 collects a first plurality of control signals 511, 521, 531 and 541 from respective CBB's 510 (X), 520 (Z), 530 (W), and 540 (Y) of the illustrated VGB. These control signals are acquired by way of respective, controls input multiplexers (14:1 Ctrl) of the respective CBB's X,Z,W,Y. There are two such controls inputting, static multiplexers (14:1 Ctrl) dedicated to each CBB. Each pair of controls input multiplexers may be considered part of the CBB to which they are dedicated as are the dedicated direct-connect (DC) drive amplifier, the 2/4/8xL drive amplifier, and the six 19:1 terms input multiplexers (19:1 Term) of each CBB.

The common controls developing section 550 further collects a second plurality of control signals 555 directly from the adjacent horizontal and vertical interconnect channels (HIC and VIC) without using the signal acquisition fingers of the surrounding CBB's. Signals 555 include the following: GR (Global Reset/Set), CLK0, CLK1, CLK2 and CLK3. CLK0 and CLK1 are clock signals that come directly off the vertical interconnect channel. CLK2 and CLK3 are clock signals that come directly off the horizontal interconnect channel GR is a Global Reset/Set signal that is universally available to all VGB's and therefore has no directional constraints It may be using for setting or resetting flip flops within the VGB in accordance with a static configuration made by the common controls section. See the example of FIG. 6. As such, GR is shown as coming in diagonally into the VGB. Such diagonal disbursement of the GR signal is not generally the best way to distribute GR. It can be alternatively carried in one or both of the vertical or horizontal interconnect channels. In one embodiment, the GR signal is carried by a dedicated GR longline provided in each of the VIC's.

Common controls developing section 550 processes the collected signals 511, 521, 531, 541, and 555, and then returns corresponding, VGB-common control signals back to the CBB's as indicated by return paths 551 through 554. In one embodiment, individual return paths 551–554 are replaced by a common return bus that transmits the same returned control signals to all the CBB's of the VGB 500A.

Common controls developing section 550 of VGB_A also produces a 'for-sharing' dynamic control signal 558 (DyOE_A) which signal is forwarded to the super-VGB's shared logic section 580. A portion of this shared logic section 580 is seen in FIG. 5. It is understood that the common controls sections of the other VGB's within the subsuming super-VGB, namely VGB's: _B, _C, and _D, respectively supply additional for-sharing, dynamic control signals DyOE_B, DyOE_C and DyOE_D (not shown) to shared logic section 580. Shared logic section 580 corresponds to SOC 150 of FIG. 1A.

Each CBB directs at least one of its respective, function output signals to shared logic section 580. Line 548 which feeds signal Yz_A to 580 is an example. It is understood that the remaining CBB's, namely, X, Z, and W of the same VGB_A respectively feed signals Xz_A, Zz_A, and Wz_A to 580. It is further understood that the CBB's of the other VGB's within the subsuming super-VGB, namely VGB's: _B, _C, and _D, respectively supply additional signals of like designations, Xz_J, Zz_J, Wz_J, and Yz_J to their respective sections 580, where _J designates here the respective one of VGB's _B, _C, and _D.

The designation 'DyOE' for signals such as 558 is intended to imply here that such a signal performs an output enabling function and that such a signal may additionally perform a dynamic selection function as be seen in FIG. 4A in the form of the DyOE_J signal 458. The designation 'Yz_A' for signals such as 548 is intended to imply here that such a signal may be output by a tri-state amplifier (or another like device having a high-Z/ high output-impedance state) such as the illustrated quartet of northern HIC-driving amplifiers 591 and/or such as the illustrated quartet of western VIC-driving amplifiers 592.

Selected ones of the Xz_J, Zz_J, Wz_J, and Yz_J signals may be routed to respective ones of input terminals (e.g., 581 and 584) of the longline driving amplifiers 591 through 594. At the same time, selected ones of the DyOE signals may be routed to respective ones of the output-enable control terminals (e.g., 582 and 583) of the longline driving amplifiers 591 through 594. Shared resources 591 through 594 may thus be used by any of the CBB's for outputting a result signal onto VGB-adjacent longlines. Although FIG. 5 only shows the connections of the respective northern quartet 591 and western quartet 592 of driving amplifiers to the north HIC and west VIC, it is understood that the southern quartet 593 and eastern quartet 594 of driving amplifiers similarly connect to a respectively adjacent, south HIC and east VIC.

Each VGB such as 500A further includes a wide gating control section 560. Section 560 collects more primitive function signals of the form $f_a(3T)$ and $f_y(4T)$ from respective CBB's X, Z, W, and Y and fold these together to generate higher level function signals of the form $f_A(nT)$ where nT indicates more independent input parameters than the number of input parameters that define the folded-together, primitive function signals. In one embodiment, the form $f_A(nT)$ includes higher level function signals $f_{WY}(5T)$ and $fXzWY(6T)$ where the subscript such as in $f_{WY}(\ )$ indicates the sources of the folded-together signals In FIG. 5, the signal designated as 5Ta corresponds to $f_{WY}(5T)$. The signal designated as 5Tb corresponds to $f_{XZ}(5T)$. As seen by the example of CBB X, the wide gating control section 560 produces these signals and then returns them to respective CBB's for output or other processing.

Although not shown, the wide gating control section 560 includes a 16-bit LUT that is also referred to herein as the 'wide-output' or WO_LUT. This VGB-centralized WO_LUT can receive the more primitive function signals of the form $f_a(3T)$ and $f_y(4T)$ from the CBB's at its respective four input terminals and can generate a corresponding $f_{WO}(nT)$ function signal at its output. The wide gating control section 560 further includes a multiplexer (not shown) for selecting one or the other of the $f_{WO}(nT)$ function signal or the $f_{XZWY}(6T)$ function signal. in FIG. 5, the signal designated as 6T/WO corresponds to the output of this multiplexer. As seen by the example of CBB Y, the wide gating control section 560 produces the 6T/WO signal and then returns it to respective CBB's for output or other processing.

Each VGB such as 500A further includes a carry-chaining section 570. CBB X (510) receives a sum bit SB0 from carry-chaining section 570. This SB0 bit represents the least significant result bit of an addition or subtraction operation that starts in CBB 510 and completes in section 570. CBB Z (520) likewise receives a next more significant sum bit SB1 from section 570. Element 530 (the W CBB) receives a yet more significant sum bit SB2 from section 570. And element 540 (the Y CBB) receives the most significant sum bit SB3 of the VGB from section 570. Each of CBB's 510–540 has the capability to output its respectively received sum bit SB0–SB3 to points outside the VGB.

As already mentioned, feed-through signals may be acquired by respective CBB's and fed-through without further transformation to the shared output components (SOC) section 580. In FIG. 5, the signals designated as FTY_A and FTX_A are examples of such feed-through signals.

Figure 6:
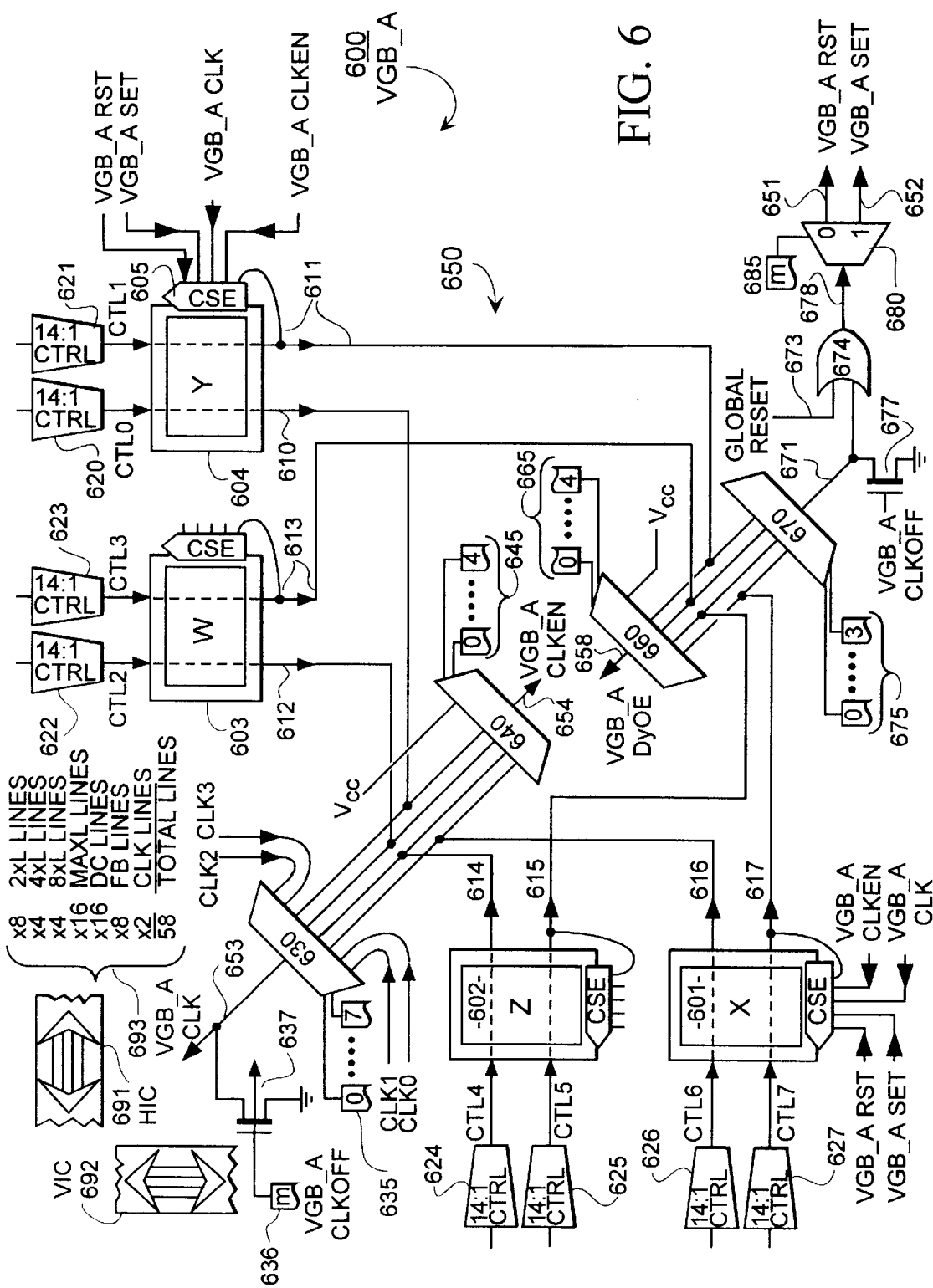
FIG. 6 is a schematic showing an embodiment of a common controls section within a VGB.

FIG. 6 illustrates an example of a common controls section for developing the DyOE signal of each respective VGB. In embodiment 650 of the common controls section, the returned control signals include a VGB_A RST (reset) signal 651, a VGB_A SET signal 652, a VGB_A CLK (clock) signal 653 and a VGB_A CLK_EN (clock enable) signal 654. These returned control signals 651–654 are returned to Configurable Sequential Elements (CSE's) of each CBB within the corresponding VGB. One such CSE is shown at 605 as part of the Y CBB 604 with the VGB_A RST, VGB_A SET, VGB_A CLK, and VGB_A CLK_EN signals being fed to it. The CSE's of the remaining CBB's 601(X), 602(Z) and 603(W) are understood to receive the same returned control signals 651–654.

In addition to the returned common control signals 651–654, each CSE receives a local control signal from its own CBB. Thus, CSE 605 receives local control signal 611 (which is alternatively denoted as CTL1) from its corresponding Y CBB 604. The CSE of the W CBB 603 similarly receives a local control signal 613 (CTL3). The CSE of the Z CBB 602 similarly receives a local control signal 615 (CTL5). The CSE of X CBB 601 similarly receives a local control signal 617 (CTL7).

Other locally-acquired control signals of the CBB's 601–604 are respectively shown at 616, 614, 612 and 610.

These locally-acquired control signals 610–617 are each obtained from locally-adjacent interconnect lines by means of a control-signal acquiring resource (CIE) of the respective CBB. CBB Y (604), for example, is seen to have two 14-to-1 control-acquiring multiplexers 620 and 621. Multiplexers 620 and 621 cross with the locally-adjacent horizontal interconnect channel (HIC) 691 in a partially populating manner. See FIG. 7.

By 'partially populating', it is meant here that HIC 691 contains more interconnect lines than are connected to by any one of multiplexers 620 and 621. Each of multiplexers 620 and 621 contains a unique subset of programmable-interconnect-points (PIP's) that form a partially-filled crossbar with HIC 691 rather than a fully-populated crossbar with HIC 691. Use of such partially-populated crossbars in place of fully-populated crossbars is known in the art. The advantage is reduced capacitive loading on the interconnect lines. The disadvantage is reduced flexibility in choosing which interconnect lines (of HIC 691) will serve as a source for an acquired control signal.

In the illustrated example, HIC 691 (the horizontal interconnect channel) contains the following resources: eight double-length (2×L) lines, four quad-length (4×L) lines, four octal-length (8×L) lines, sixteen full-length (MaxL) lines, sixteen direct-connect (DC) lines, eight feedback (FB) lines and two dedicated clock (CLK) lines. This total of 58 lines is summarized at 693 in FIG. 6.

From among these 58 lines, the two dedicated clock (CLK) lines do not participate in the partially populating scheme of each of multiplexers 620 and 621 or in the partially populating scheme of each of the linearly adjacent, multiplexers 622 and 623. The remaining 56 HIC lines may be subdivided into four unique subsets of 14 lines each (4×14=56). In accordance with the invention, each of control-acquiring multiplexers 620–623 has its respective 14 inputs (MIP's) connected to a respective one of the four unique subsets of lines. Thus, a control signal may be acquired from any one of the locally-adjacent 56 HIC lines by at least one of the adjacent four multiplexers 620–623.

The adjacent vertical interconnect channel (VIC) 692 contains a same mix of interconnect resources (although not the same lines) and further carries the global reset (GR) line. Except for this GR line and the two dedicated CLK lines, the remaining 56 lines of VIC 692 may be subdivided into four unique subsets of 14 lines each. And in accordance with the invention, each of control-acquiring multiplexers 624–627 has its respective 14 inputs (MIP's) connected to a respective one of the four unique subsets of VIC lines. Thus, a control signal may be acquired from any one of the locally-adjacent 56 VIC lines by at least one of the adjacent four multiplexers 624–627. However, it should be understood that once one of four multiplexers 624–627 is consumed for acquiring a first control signal from its unique subset of VIC lines, connection to the remaining lines of that unique subset via that consumed multiplexer is no longer possible.

Figure 7:
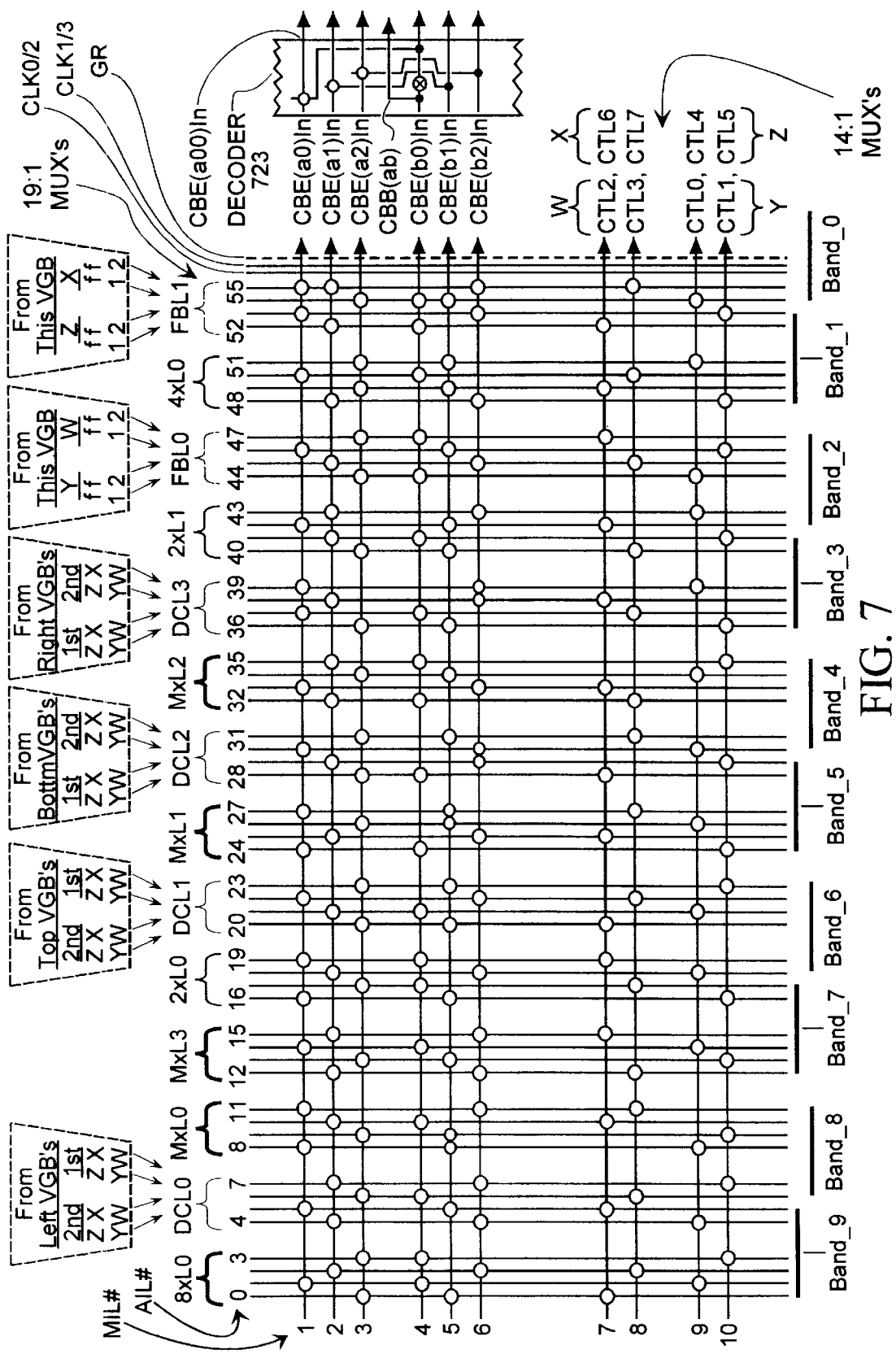
FIG. 7 illustrates an MIL fingers arrangement in accordance with the invention.

FIG. 7 illustrates one partial-populating scheme in accordance with the invention for the 56 lines of each HIC or VIC. It is within the contemplation of the invention to use other partial populating patterns. It is also within the contemplation of the invention to have overlap between acquirable line sets by using control acquiring multiplexers with more MIP's if desired, but of course that also increases space utilization within the integrated circuit.

Because each of the control-signal acquiring multiplexers 620 through 627 (FIG. 6) is capable of acquiring control signals from a unique subset of lines in respective one or the other of HIC 691 and VIC 692, the combination of multiplexers 620 through 627 can acquire control signals from an even larger unique subset of adjacent interconnect lines (AIL's). In accordance with the invention, the control-signal acquiring capabilities of all the peripheral multiplexers 620–627 are made common to the VGB 600.

As such, it is seen that a resource-merging multiplexer 630 is provided in section 650 with eight inputs for respectively receiving the following signals: 614 and 616 (respectively from multiplexers 624 and 626 of the Z and X CBB's), 610 and 612 (respectively from multiplexers 620 and 622 of the Y and W CBB's), CLK0 and CLK1 (directly from VIC 692), and CLK2 and CLK3 (directly from HIC 691). Multiplexer 630 may output a selected one of these eight inputs onto the VGB_A CLK line 653. Alternatively, line 653 may be pulled low by N-channel transistor 637. The gate of transistor 637 is driven by configuration memory bit 636. Signal 636 (VGB_A CLKOFF) is also applied to the gate of a later-described, second transistor 677.

The eight inputs of multiplexer 630 may be independently selected or not in accordance with the setting of eight corresponding configuration memory bits 0 through 7, which bits are indicated at 635. The logic levels on line 653 define the VGB_A CLK signal that is commonly applied to the CSE's of the corresponding VGB_A. When line 653 is pulled low by transistor 637, corresponding flip-flops (not shown) in each of the CSE's (e.g., 605) are blocked from changing state.

A second resource-merging multiplexer 640 is provided in section 650 for also receiving control signals 610 (CTL0), 612 (CTL2), 614 (CTL4) and 616 (CTL6). Multiplexer 640 has a fifth input which receives the Vcc signal (logic 1). Five configuration memory bits 645 may be respectively used to designate which of the inputs of multiplexer 640 will appear on its output line 654 (VGB_A CLKEN_). When line 654 is high (at Vcc), the commonly controlled flip-flops in the CSE's of VGB_A are enabled to respond to the clock signal on line 653.

A third resource-merging multiplexer 670 of section 650 has four input terminals respectively connected to receive the following control signals: 611 (CTL1 from multiplexer 621), 613 (CTL3 from multiplexer 623), 615 (CTL5 from multiplexer 625) and 617 (CTL7 from multiplexer 627). Four configuration memory bits 675 may be respectively used for causing one or none of the four inputs to appear on output line 671. N-channel transistor 677 is further coupled to line 671 for driving line 671 low (to logic 0) when the VGB_A CLKOFF memory bit 636 is high.

Line 671 connects to a first input of OR gate 674. A second input of OR gate 674 receives the global reset signal (GR) by way of line 673. The output of OR gate 674 is applied to an input 678 of de-multiplexer 680. Configuration memory bit 685 controls de-multiplexer 680. If memory bit 685 is in the logic zero state, the dynamic signal on output line 678 appears on output line 651 of the de-multiplexer 680 while output line 652 remains in the inactive, default state (no SET). Conversely, if memory bit 685 is in the logic 1 state, the dynamic signal on output line 678 is transferred to output line 652 (VGB_A SET) while line 651 remains in the inactive, default state (no RESET).

De-multiplexer 680 therefore enables either of the global reset (GR) signal on line 673 or the local reset signal on line 671 to be programmably directed to act as a set or reset signal for the commonly controlled flip-flops (not shown) of all the CSE's in VGB_A 600. The CLKOFF configuration bit 636 can be used to block the local reset signal from appearing on line 671.

A fourth resource-merging multiplexer 660 is provided within section 650 for receiving the following input signals: 611 (CTL1), 613 (CTL3), 615 (CTL5) and 617 (CTL7). Multiplexer 660 additionally receives the Vcc level at a fifth input. Five configuration memory bits 665 determine which, if any, of the five inputs of multiplexer 660 will appear on output line 658 (VGB_A DyOE). The VGB_A DyOE signal 658 is supplied to the shared logic section 580 of the VGB as indicated by 558 in FIG. 5.

FIG. 7 illustrates a partial-populating scheme for the input-term and control-signal acquiring fingers (multiplexers) of the respective X, Z, W, and Y Configurable Building Blocks of one embodiment in accordance with the invention. The adjacent interconnect lines (AIL's) are respectively numbered as 0 through 55. The two dedicated CLK lines of each interconnect channel and the additional GR line in each VIC are not included in this count. In one embodiment, AIL's 0–55 represent interconnect lines in the most immediately adjacent channel for each of CBB's X, Z, W, and Y.

In an alternate embodiment, AIL's 0–55 represent interconnect lines in the most immediately adjacent channel for each of CBB's X and Y while for the other CBB's, Z and W, the AIL's 0–55 of FIG. 7 represent the interconnect lines of the next adjacent channel. The exception is at the periphery of the matrix (see FIG. 2) where there is no next adjacent channel, in which case AIL's 0–55 represent interconnect lines in the most immediately adjacent channel also for CBB's Z and W. This alternate configuration allows each VGB to acquire input term signals and control signals from both the even-numbered and odd-numbered interconnect channels that surround it. It is of course within the contemplation of the invention to have other configurations, such as for example wherein the CBB's that reach the most immediately adjacent channel are X and W rather than X and Y; and such as wherein the CBB's that reach the next adjacent channel are X and Y rather than Z and W.

Multiplexer input lines (MIL's) are numbered in FIG. 7 as 1 through 10. MIL's 1–3 correspond to the three 19:1 input term acquiring multiplexers (fingers) of a first CBE (e.g., 'a') in each of the X, Z, W, Y CBB's. MIL's 4–6 correspond to the three 19:1 input term acquiring multiplexers of a second CBE (e.g., 'b') in each of the X, Z, W, Y CBB's. MIL's 7–8 correspond to the two 14:1 control signal acquiring multiplexers of each of the W and X CBB's. MIL's 9–10 correspond to the two 14:1 control signal acquiring multiplexers of each of the Y and Z CBB's.

The illustrated partially-populated distribution of PIP's over the intersections of AILS's 0–55 and MIL's 1–10 should be self-explanatory. Each open circle represents a statically-programmable interconnect point through which entering lines continue linearly in the schematic. Activation of the PIP creates a closed connection between the crossing-through lines. Deactivation of the PIP during the FPGA configuration phase leaves the crossing-through lines disconnected from one another. The only exception to this is the POP symbol (open circle with an 'X' in it) shown coupled to CBE(b0)In. Activation of the POP (Programmable Opening Point) creates an open circuit between the colinear lines of that symbol. Deactivation of the POP during the FPGA configuration phase leaves the colinear lines of that symbol connected to one another.

AIL's 0–3 represent the four 8xL lines in each interconnect channel. AIL's 4–7 represent a first group (DCL0) of four of the 16 direct connect lines in each interconnect channel. The remaining DCL's are represented by the 20–23 (DCL1), 28–31 (DCL2) and 36–39 (DCL3) sets of AIL's. AIL's 8–11 represent a first group (MxL0) of four of the 16 MaxL lines in each interconnect channel. The remaining MxL's are represented by the 24–27 (MxL1), 32–35 (MxL2) and 12–15 (MxL3) sets of AIL's.

AIL's 16–19 represent a first group (2xL0) of four of the 8 2xL lines in each interconnect channel. The other four 2xL lines are represented by the 40–43 (2xL1) group. AIL's 44–47 represent a first group (FBL0) of four of the 8 feedback lines in each interconnect channel. The other four feedback lines are represented by the 52–55 (FBL1) group. AIL's 48–51 represent the four 4xL lines in each interconnect channel.

Signal sources for the direct connect lines and the feedback lines are indicated respectively above corresponding AIL groups. In group DCL0 for example, AIL 7 is driven by either the X or the W DC driver of the neighboring VGB that is immediately to the left of the current VGB. AIL 6 is driven by either the Z or the Y DC driver of the neighboring VGB that is immediately to the left of the current VGB. AIL 5 is driven by either the X or the W DC driver of the next, not immediately-neighboring VGB that is to the left of the current VGB. AIL 4 is driven by either the Z or the Y DC driver of the next-adjacent VGB that is to the left of the current VGB.

Each of MIL's 0–6 is loaded by essentially the same number of 19 PIP's that form the corresponding 19:1 multiplexer. As such, there is roughly a same amount of signal propagation delay in going through each such multiplexer to the corresponding LUT. There is some additional delay or loading from PIP's and POP's that form the intervening decoder layer. A representative part of that layer is shown at 723.

Note that for each of AIL's 0–55 there are at least two PIP connections to two different MIL's, one of which is placed in the MIL# 1–3 set and another of which is in general, differently placed in the MIL# 4–6 set. In other words are at least two possible MIL's which can be used to acquire an input term signal moving along a given AIL and feed the acquired signal to one or the other of two possible LUT's ('a' or 'b') of the subsequent primitives layer. Thus if one of the two 19:1 multiplexers that can couple to a given AIL is already consumed, or the corresponding LUT is already consumed, the FPGA configuring software has the possibility of alternatively using the other multiplexer and/or LUT for implementing a design circuit chunk that requires a particular input term signal moving along the given AIL.

Each of AIL's 54 and 55 have at least three PIP connections to a respective three different MIL's. Feedback signals from the f1 and f2 lines of the X output element (CSE) therefore have 3 possible ways of being transmitted into the respective MIL 1–6 inputs of any one of the X, Z, W, and Y Configurable Building Blocks of the same VGB. These MIL 1–6 inputs are alternatively named as CBE(a0)In, CBE(a1) In, CBE(a2)In, CBE(b0)In, CBE(b1)In, and CBE(b2)In in FIG. 7. Note that CBE(b0)In is different from the others in that a POP (Programmable Opening Point) is provided for it in decoder section 723. CBB(ab) represents an intercepted signal that may be used for compounding or folding together the 'a' and 'b' parts of the corresponding CBB to thereby synthesize a larger LUT. The same CBB(ab) signal may also represents a feed-through signal (FTY or FTX), particularly when CBB(ab) is not needed for producing a folded-together function signal of the form $f_A(mT)$ where m>3.

Note also that in the case where the PIP's of the signal-acquiring multiplexers of FIG. 7 are of the bidirectional type, simultaneous activation of two or more PIP's on a same AIL (during FPGA configuration time), creates a bidirectional strapping inter-connection between the corresponding MIL's of those PIP's. Such a use of the PIP's of the signal-acquiring multiplexers of FIG. 7 falls herein under the description, 'through-the-AIL strapping'. Not every embodiment however can use this kind of through-the-AIL strapping in a generic way to strap from one MIL to a next a signal that had been generically sourced onto a line other than the strapping AIL. One of the requirements is that the PIP's in the signal-acquiring multiplexers of FIG. 7 be conductive enough (large enough in terms of RC time constant) to get signals through within the system-specified time. If these PIP's are too small, such use of through-the-AIL strapping should be avoided. On the other hand, if the signal that is being strapped onto the two MIL's was sourced onto the strapping AIL from an appropriate AIL drive amplifier, the size of the PIP's of the signal-acquiring multiplexers of FIG. 7 should not be an impediment to carrying on through-the-AIL strapping because the drive amplifier is designed to drive the signal in timely fashion through those loads.

Note further that in the case where the PIP's of the signal-acquiring multiplexers of FIG. 7 are again of the bidirectional type, simultaneous activation during FPGA configuration time of two or more PIP's on a same MIL (multiplexer input line), can create a bidirectional strapping interconnection between the corresponding AIL's of those PIP's. Such a use of the PIP's of the signal-acquiring multiplexers of FIG. 7 is referred to herein as 'through-the-MIL strapping' The latter function may be particularly useful when a signal is being acquired via a direct connect line (DCL) from another VGB and it is desirable to simultaneously couple such a DCL-carried signal to another kind of AIL within the interconnect channel, say to a vertical 2×L line when the direct connect source was a horizontally displaced VGB. Again, not every embodiment can use through-the-MIL strapping. If the PIP's of the signal-acquiring multiplexers are too small, and the DC drive amplifiers are not powerful enough to drive the added load, the through-the-MIL strapping function should be avoided and other means should be used for routing signals. For example, switch boxes may include PIP's for providing configuration-defined coupling of a signal sourced on a passing-through direct connect line (not shown) to passing-through 2×L, 4×L and/or 8×L lines.

The connection arrangement shown in FIG. 7 illustrates one possible layout arrangement for the various, differentiated conductors of the interconnect channel. This layout organization is formed by spaced-apart, layout 'bands' 0 through 9 as shown at the bottom of FIG. 4. Each band (except 0) has 6 adjacent interconnect lines (AIL's) and generally 2 PIP's per multiplexer input line (MIL). Other layouts are of course possible.

Note that the lines of band 0 are positioned closest to the side of the corresponding CBB. This helps to minimize the distance that timing-critical signals such as CLK0–3 and GR (global reset) travel from a CBB source before entering into the CSS of a destination CBB. The lines of bands 1 and 2 are positioned successively next closest to the side of the corresponding CBB. This helps to minimize the length of VGB-circumscribing lines, particularly the so-called, feedback lines (of groups FBL0 and FBL1). The quad-length (4×L0) lines may be used to facilitate certain signal-strapping functions of an adjacent decoding layer 423, which is why the 4×L0 lines are also included in band 1. MaxL lines and direct connect lines (DCL's) tend to have substantially larger capacitances than FBL's and 2×L lines. The MaxL lines and DCL's are thus generally relegated to positions in the outer-more ones of bands 3–9 because distance of signal travel from a source CBB to a destination CBB, through one of these larger-capacitance conductors is less critical When the PIP-distribution scheme of FIG. 7 is used, each of the control-signal acquiring multiplexers MIL's 7–10 allows its respective CBB to acquire control signals from a unique subset of lines in respective one or the other of its adjacent HIC or VIC.

Figure 8A:
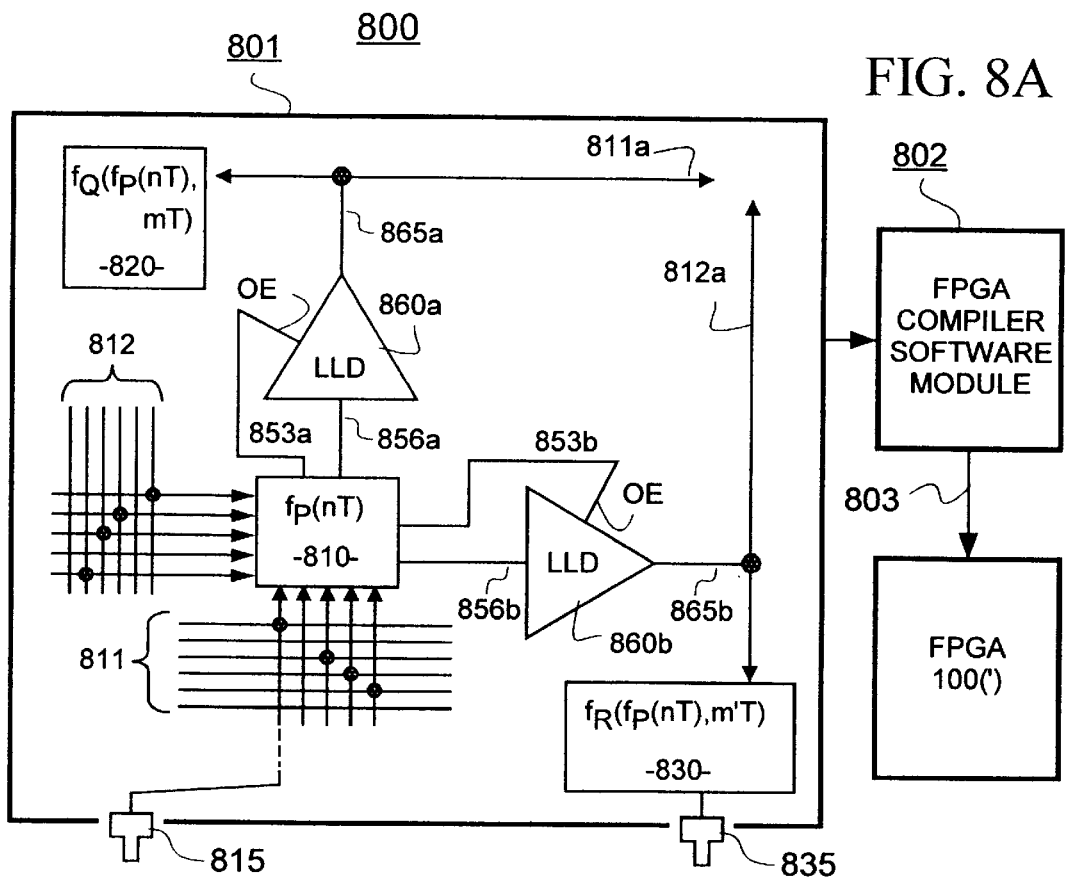
FIG. 8A is a block diagram of an FPGA configuring process.

Referring to FIG. 8A, a schematic diagram 800 is provided of an FPGA configuring process wherein a predefined design definition 801 is supplied to an FPGA compiling software module 802. Module 802 processes the supplied information 801 and produces an FPGA-configuring bitstream 803. Bitstream 803 is supplied to an FPGA such as 100 or 100' of respective FIGS. 1A and 1B for accordingly configuring the FPGA.

The design definition 801 may include a to-be-shared first function block 810 that produces a first result signal of the form, $f_P(nT)$, where P is an arbitrary function identifier and nT represents a corresponding number of independent input terms that are to-be acquired and processed to produce the first result signal, $f_P(nT)$.

Design definition 801 may further include a second function block 820 that produces a second result signal of the form, $f_Q(f_P(nT),mT)$, where Q is an arbitrary function identifier and mT represents a corresponding number of independent input terms which, in addition to the first result signal, $f_P(nT)$, are to-be-acquired and processed to produce the second result signal, $f_Q(f_P(nT),mT)$.

Design definition 801 may further include a third function block 830 that produces a third result signal of the form, $f_R(f_P(nT),m'T)$, where R is an arbitrary function identifier and m'T represents a corresponding number of independent input terms which, in addition to the first result signal, $f_P(nT)$, are to-be-acquired and processed to produce the second result signal, $f_Q(f_P(nT),m'T)$.

Alternatively, either of function modules 820 and 830 can be an IOB that needs to receive the first result signal, $f_P(nT)$, but is 'stuck' at a particular location or in a particular region because the particular pad or package pin (lead) of that IOB, such as pin 835, is fixed in position and has been given a correspondingly fixed function Alternatively, either of function modules 820 and 830 can be an embedded memory block (e.g., ML0 of FIG. 2) that needs to receive the first result signal, $f_P(nT)$, but whose placement is constrained to a particular location or to a particular column or row because of various design considerations.

Additionally or alternatively, the first function module 810 may have its placement either fixed or constrained to a relatively small region because the first function module 810 needs to acquire a particular one or more input terms from one or both of signal buses 811 and 812, or from a particular pad or package pin, such as pin 815, which pin 815 is fixed in position and given a fixed function. Stated in more general terms, there may be a first design 'pull' that urges the placement of first function module 810 towards a first position in the ultimate FPGA 100. At the same time, there may be other design 'pulls' that urge the respective placements of second and third modules 820 and 830 towards respective second and third placements that are spaced apart by relatively large distances of FPGA 100 from the first position of first module 810.

Although it may appear from the drawing that function modules 810, 820 and 830 are pre-ordained to respectively correspond to VGB's (or IOB's or memory blocks for case of 820, 830) that are operatively coupled together by way of MaxL lines such as 811a, 812a and by way of tristate longline-drivers such as 860 a and 860b, that is not inherently true. Although it may appear from the drawing that the number nT of input terms is pre-ordained to be respectively acquired from adjacent HIC's and VIC's of module 810, namely from HIC 811 and VIC 812, that also is not inherently true. The design definition 801 may be originally expressed in a variety of ways which do not pre-ordain such an outcome.

Modern circuit designs typically start with a Very High-level Descriptor Language (VHDL) or the like for defining the behavior of a to-be-implemented design at a level that is significantly higher than a gate-level or transistor level description. High level design definitions are often entered by designers into computer-implemented programs that are commonly referred to by names such as VHDL synthesis tools. The output of the VHDL synthesis tools may be in the form of one or more computer files that constitute VHDL descriptions of the to-be-implemented design. VHDL description files may include one or more different kinds of constructs including VHDL Boolean constructs that define part or all of the design. The complexity of the Boolean functions can span a spectrum having very simple ones (e.g., those having 1–3 input terms) at one end to very complex ones at the other end. The high level definitions generally do not specify implementational details. That job, if an FPGA is to be used for implementation, is left to the FPGA compiler software module 802.

In performing various partitioning, placement and routing analyses, the FPGA compiler software module 802 may come to realize that the number of nT input term signals needed for producing the first result signal, $f_P(nT)$, may be more efficiently and cost-effectively acquired at a position that is: (a) adjacent to a particular horizontal interconnect channel, HIC 811 exists; or (b) adjacent to a particular vertical interconnect channel, VIC 812 exists; or (c) where the particular horizontal interconnect channel, HIC 811 crosses with the particular vertical interconnect channel, VIC 812; or (d) adjacent to a particular I/O pad or pin 815. Any one or more of these realizations advocates for a specific placement of module 810 into a VGB or SVGB that resides immediately adjacent to at least one or more of the particular HIC 811 and the particular VIC 812 and the particular pin or pad 815.

The FPGA compiler software module 802 may come to further determine that there are function modules such as 820 and 830 that will need to receive the produced, first result signal, $f_P(nT)$. Due to other considerations however, function modules 820 and 830 may need to be placed at respective second and third positions that relatively far away within the FPGA array from the first placement position of first function module 810. More specifically, the FPGA compiler software module 802 may come to determine that the number of mT input term signals needed for producing the second result signal, $f_Q(f_P(nT),mT)$, may be more efficiently and cost-effectively acquired at a second position that is spaced away horizontally from the first placement position of function module 810 by a relatively large distance within the FPGA array and that it would be best for timing or other requirements to use a horizontal longline such as 811a for coupling the first result signal, fp(nT) to the second function module 820.

Similarly, the FPGA compiler software module 802 may come to determine that the number of m'T input term signals needed for producing the third result signal, $f_R(f_P(nT),m'T)$, may be more efficiently and cost-effectively acquired at a third position that is spaced away vertically from the first placement position of function module 810 by a relatively large distance within the FPGA array and that it would be best for timing or other requirements to use a vertical longline such as 812a for coupling the first result signal, $f_P(nT)$ to the third function module 820.

As seen in FIG. 8A, horizontal line 811a is to be driven by line driver 860a. Vertical line 812a is to be driven by line driver 860b. Line drivers 860a and 860b may be tristate drivers or other kinds of drivers. The tristate versions of these drivers will include output enable terminals such as 853a and 853b. The drivers will also include inputs such as 856a and 856b. Terminals 856a, 856b are coupled to a shared output component (SOC) such as 150, 150' of FIGS. 1A–1B so that the same first result signal, $f_P(nT)$ can be programmably-routed symmetrically to either one or both of longlines 811a and 812a for transport to spaced-away function modules such as 820 and 830.

It should be apparent in view of the above disclosure that circuit space in the FPGA may be conserved if the first result signal, $f_P(nT)$ can be produced by only one VGB or SVGB that is placed immediately adjacent to one or both of HIC 811 and VIC 812 instead of being repeatedly produced by multiple VGB's or SVGB's. The FPGA compiler software module 802 would have more degrees of freedom in making optimization moves during partitioning, placement and routing if the once-produced, first result signal, $f_P(nT)$ can be programmably-routed symmetrically to either one or both of longlines 811a and 812a for transport to spaced-away function modules such as 820 and 830.

Figure 8B:
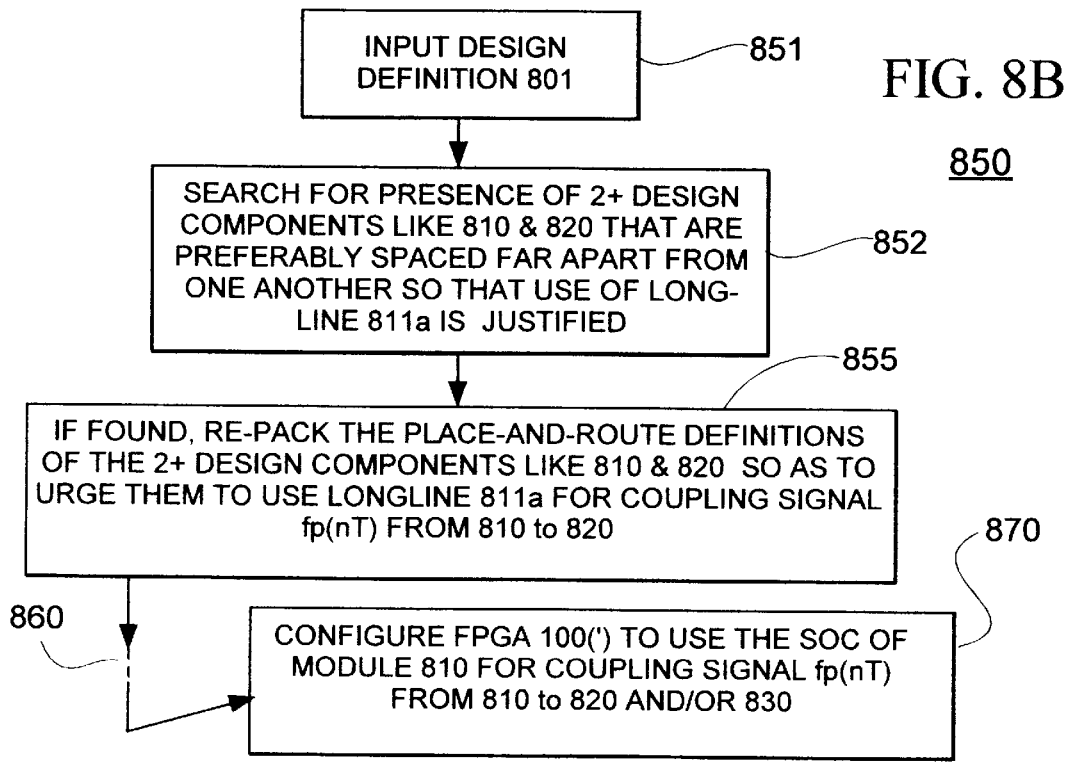
FIG. 8B is a flow chart of an FPGA configuring process that includes steps in accordance with the invention.

FIG. 8B illustrates a flow chart of a process 850 that attempts to do so. A design definition such as 801 is input at step 851 into the FPGA compiler software module 802. (It is understood that module 802 may be implemented in a general purpose computer.) Numerous processing steps may take place within software module 802. Step 852 is one of those steps in which the software module 802 searches through the input design definition (e.g., 801) for the presence of two or more design components like 810 and 820 that are preferably spaced far apart from one another (e.g., by more than the reach of a 4×L line or a direct connect line) and yet call for the first design component 810 to deliver a result signal, $f_P(nT)$ to at least the spaced-away second design component 820 and, for more efficiency in use of longlines, to yet other spaced-away second design components such as 830. Stated otherwise, the use of longline 811a for transferring the first result signal, $f_P(nT)$ from first module 810 to second module 820 becomes more and more justified as the spacing between function modules 810 and 820 increases and as additional modules are found either immediately along or justifiably near longline 811a that also need to receive the first result signal, $f_P(nT)$. Each of these efficiency-enhancing factors weighs in favor of consuming longline 811a (at least during a given time slot) for carrying the first result signal, $f_P(nT)$ from source position 810 to destination positions such as 820. More specifically, if the design specification 801 calls for the first result signal, $f_P(nT)$ to be delivered to destination module 820 in less than a prespecified time limit, and destination module 820 wants to be placed so far away from source module 810 that use of general interconnect (e.g., 2×L, 4×L lines) would violate the timing constraint, then use of longline 811a becomes justified. (By the terminology, "module 820 wants to be placed", we mean that the same kinds of software weighting factors that urge module 810 into placement adjacent to HIC 811 and/or VIC 812 for acquiring its nT input terms, urge module 820 into placement adjacent to other HIC's and/or VIC's (not shown) for acquiring its mT input terms.)

At step 855, if two or more design components like 810 and 820 are found to satisfy the search criteria, the place-and-route definitions of those design components are repacked so as to urge those definitions toward ultimately ending up using a longline like 811a for coupling signal $f_P(nT)$ from source module 810 to destination module 820.

It is understood by those skilled in the art of FPGA configuration that some design factors (such as sharing of the $f_P(nT)$ signal) may pull the two design components like 810 and 820 toward closer placement relative to one another in the FPGA and that other design considerations may push them far apart (such as the non-shared nT and mT input term signals). Similarly, some design factors (such as time constraints on the $f_P(nT)$ signal) may weigh in favor of using a longline for routing a particular signal while other factors may weigh against such a routing decision. The longline-favoring factor produced in step 855 is just one of such plural weighting factors. Other weighting factors may cause the ultimate configuration to not use the place and route configuration suggested by the illustration in box 801 of FIG. 8A.

Dashed path 860 of FIG. 8B represents many other processes within the software module 802 wherein the original design definition 801 is transformed by steps such as design-partitioning, partition-placements and inter-placement routings to create a configuration file for the target FPGA 100 or 100'. Step 870 assumes that at least two design components like 810 and 820 were found and were ultimately partitioned and placed far apart while a decision was made to use either a horizontal (811a) or vertical (812a) longline for intercoupling the $f_P(nT)$ signal. In that case, at step 870 the target FPGA 100(') is configured to use a shared output component (SOC) such as 150, 150' of FIGS. 1A–1B for coupling a signal such as $f_P(nT)$ from a first-placed module such as 810 to one-or more distally placed modules such as 820 and 830.

Various modifications and variations in accordance with the spirit of the above disclosure will become apparent to those skilled in the art after having read the foregoing. For example, the longline drivers need not be tristate line drivers but instead may be other kinds of line driver such as an open collector line drivers. The utilized longline for carrying the $f_P(nT)$ signal need not be a MaxL line but instead may be a line of slightly smaller length such as an 8×L line or a 16×L line or a 0.5MaxL line.

Given the above disclosure of general concepts and specific embodiments, the scope of protection sought is to be defined by the claims appended hereto.

What is claimed is:

1. A signal routing method for use in a field programmable gate array (FPGA) device having a plurality of variable grain blocks (VGB's) and differently-directed. interconnect channels interconnecting the VGB's, wherein each VGB includes primitive building blocks that can be programmably folded-together and further wherein each VGB is programmably-configurable to selectively and independently acquire input term signals from adjacent and differently-directed interconnect channels and to produce one or more respective result signals of respective configurable granularities from the acquired signals, and further wherein each VGB is coupled to supply at least one of its result signals to a shared output component (SOC) that is shared by plural VGB's, the SOC having configurable routing means for programmably-routing received result signals to any one or plural ones of the differently-directed ones of the interconnect channels that are adjacent to the SOC, and further wherein each VGB is programmably-configurable to selectively and independently acquire control signals from its adjacent and differently-directed interconnect channels and to use at least one of its acquired control signals for deriving a respective route-selection signal and supplying the route-selection signal to a corresponding SOC; said method comprising the steps of:

(a) configuring one or more of said VGB's to each supply as its respective route-selection signal to a corresponding SOC a selection signal that causes the corresponding SOC to route a designated result signal to a pre-identified one or plural ones of the differently-directed, interconnect channels that are adjacent to the SOC; and (b) configuring at least one of said VGB's to produce and supply said designated result signal to the corresponding SOC so that said designated result signal will be routed to the pre-identified one or plural ones of the differently-directed, interconnect channels that are adjacent to the corresponding SOC.

2. The method of claim 1 wherein:
each VGB has a common controls section that is programmable for selecting for distribution within its VGB, common control signals derived from said independently acquired control signals of its VGB; and (a.1) said route-selection signal is derived from the common controls section of the same VGB that supplies the route-selection signal.

3. The method of claim 1 wherein:

(a.1) said route-selection signal is obtained from one of plural acquisition fingers of the VGB and each VGB includes a programmable post-acquisition decoder for internally duplicating and routing acquired input term signals in accordance with selected ones of said configurable granularities.

4. The method of claim 1 wherein:

(b.1) each VGB includes a plurality of at least four Configurable Building Blocks for producing its one or more respective result signals of respective configurable granularities.

5. The method of claim 1 wherein:

(b.1) said plurality of VGB's each includes a plurality of acquisition fingers for acquiring from a set of adjacent interconnect lines (AIL's) in the adjacent interconnect channels of the VGB, a subset of acquired signals;

(b.2) each VGB includes a programmable post-acquisition decoder for internally duplicating and routing acquired input term signals in accordance with selected ones of said configurable granularities; and (b.3) said configuring of the at east one VGB to produce and supply the designated result signal includes making use of the acquisition fingers and the post-acquisition decoder of the at least one VGB to define its respective result signals from the subset of acquired signals.

6. The method of claim 5 wherein said AIL's in each adjacent channel include conductor lines selected from at least two of a group consisting of:

(b.1a) a linear double-length (2×L) line having a length corresponding to two VGB's;

(b.1b) a linear quad-length (4×L) line having a length corresponding to four VGB's; an (b.1c) a linear octal-length (8×L) line having a length corresponding to eight VGB's.

7. The method of claim 5 wherein said AlL's include conductor lines selected from at least two of a group consisting of:
(b.1a) a linear maximum-length (MaxL) line;
(b.1b) a nonlinear direct connect line (DCL); and
(b.1c) a nonlinear feedback line (FBL).

8. The method of claim 1 wherein:
said SOC has a plurality of dynamic multiplexers each having plural input terminals capable of respectively receiving corresponding result signals from the VGB's that share that SOC, and where each said dynamic multiplexer further has a dynamically-controllable select terminal capable of dynamically selecting a signal on one of said plural input terminals for output from an output terminal of the dynamic multiplexer to a line in a corresponding interconnect channel, and
(a.1) said route-selection signal is supplied to a dynamically-controllable select terminal of one of said dynamic multiplexers.

9. A programmed FPGA device comprising:
(a) a plurality of line-drivers coupled to interconnect lines within differently-directed interconnect channels;
(b) a plurality of variable grain blocks (VGB's), wherein each VGB is programmably-configurable to, and at least one of the VGB's is programmably-configured to, acquire input term signals from differently-directed and adjacent ones of the interconnect channels, to granularly process the acquired input term signals and correspondingly generate processing result signals of granulation-dependent complexity from the acquired input term signals, and to supply respective ones of the processing result signals for routing into a corresponding one or more of said line-drivers;
(c) a plurality of dynamic multiplexers coupled between said programmably-configurable VGB's and said line-drivers, said dynamic multiplexers having plural input terminals capable of respectively receiving said plurality of result signals from the VGB's, and where said dynamic multiplexers further each have a dynamically-controllable select terminal capable of dynamically selecting a signal on one of said plural input terminals for output from an output terminal of the respective dynamic multiplexer to a respective one of the line-drivers; wherein:
(b.1) at least two of said VGB's are configured to each supply a respective selection signal to the select terminal of a configuration-specified dynamic multiplexer; and
(b.2) said at least one of said VGB's is configured to supply a respective result signal respectively to an input terminal of each of at least two of the dynamic multiplexers where the at least two dynamic multiplexers respectively drive the line drivers of respective and differently-directed ones of the interconnect channels.

10. The method of claim 5 wherein said VGB's form an array and said AIL's include conductor lines selected from at least three of a group consisting of:
(b.1a) a linear maximum-length (MaxL) line extending continuously and fully across the array formed by said VGB's;
(b.1b) a short-haul, linear general interconnect line extending continuously for a distance of at least 2 VGB's but less than a linear distance fully across the array formed by said VGB's; and
(b.1c) an intermediate-haul, linear general interconnect line extending continuously for a distance of at least 8 VGB's but less than a linear distance fully across an array formed by said VGB's
(b.1d) a nonlinear direct connect line extending continuously and being dedicated for broadcasting a signal from a correspondingly dedicated, source one of said VGB's to a corresponding cluster of neighboring ones of said VGB's.

11. The method of claim 10 wherein said AlL's of each channel include the linear maximum-length (MaxL) line and the configurable routing means of each SOC includes means for programmably-routing received result signals to any one or plural ones of the MaxL lines in the differently-directed ones of the interconnect channels that are adjacent to the SOC.

12. A configuring method for configuring a field programmable gate array (FPGA) device to provide for flexible transmission of a first function signal produced by a respectively placed implementation of a first function generator within a corresponding first of plural variable grain blocks (VGB's) disposed as an array in the FPGA device, where the provided flexible transmission allows the first function signal to be transmitted by way of specialized lines within differently-directed, VGB-interconnecting channels to other of the VGB's that are arbitrarily distal from the first VGB by a distance within the reach of the specialized VGB-interconnecting lines and along one or the other of the different directions of the VGB-interconnecting channels, said VGB-interconnecting channels also including general-interconnect resources that can be programmed to alternatively or additionally transmit the first function signal through one or more switchboxes to said other of the VGB's, said transmission through the switchboxes causing a greater signal propagation delay than said corresponding transmission through one or more of the specialized lines; wherein:
(0.1) each specialized line continuously spans a distance of at least 8 VGB's;
(0.2) each VGB has two differently-directed, VGB-interconnecting channels extending adjacent to that VGB;
(0.3) each VGB includes input term signal acquiring fingers each for independently and selectively acquiring a respective input term signal from an adjacent interconnect channel, the input term signal acquiring fingers of the VGB being able to acquire their input term signals from the differently-directed, VGB-interconnecting channels that extend adjacent to that VGB;
(0.4) each VGB includes programmably-compoundable and independently-configurable, function building blocks that are coupled to the VGB's input term signal acquiring fingers and that can independently produce from the acquired input term signals, respective ones of primitive function signals and can, if compounded-together, produce a corresponding one or more, more complex function signals;
(0.5) each VGB includes a programmably-configurable, post-acquisition decoder circuit interposed between the VGB's input term signal acquiring fingers and the VGB's function building blocks for transparently passing the VGB's acquired input term signals to, or duplicatively rerouting one or more of the VGB's acquired input term signals to, the VGB's function building blocks so as to support respective synthesizings of said primitive function signals and said more complex function signals in the VGB;
(0.6) each VGB includes control signal acquiring fingers each for independently and selectively acquiring a respective control signal from an adjacent interconnect channel, the control signal acquiring fingers of the VGB being able to acquire their control signals from the differently-directed, VGB-interconnecting channels that extend adjacent to that VGB;

(0.7) for each sharing group of at least two VGB's the FPGA device has a corresponding, shared output component (SOC) that is coupled to the sharing group and to the specialized lines in differently-directed, VGB-interconnecting channels that extend adjacent to that SOC, where:

(0.7a) the SOC is configurable to selectively receive respective function signals produced from the SOC's group of sharing VGB's, and (0.7b) the SOC is configurable to selectively output its received function signals, each to one or both of the specialized lines in differently-directed ones of the VGB-interconnecting channels that extend adjacent to that SOC;

and wherein said FPGA configuring method comprises:

(a) programming at least a first of said VGB's to produce a respective first function signal from input term signals acquired by the first VGB from at least one of the differently-directed, VGB-interconnecting channels that extend adjacent to that first VGB; and (b) programming a corresponding first SOC that is shared by the sharing group of the first VGB so that the first SOC outputs the first function signal to at least one of the specialized lines in the differently-directed ones of the VGB-interconnecting channels that extend adjacent to that SOC.

13. The FPGA configuring method of claim 12 wherein:

(0.5a) the programmably-configurable, post-acquisition decoder circuit of each VGB includes a feedthrough mechanism which can be programmed to feed certain ones of the acquired input term signals through the VGB's function building blocks without using the using the fedthrough signals for synthesizing said primitive function signals and to instead pass the fedthrough signals to the corresponding SOC that is shared by the sharing group of the VGB;

(0.7c) the SOC of each sharing group is configurable to selectively receive respective fedthrough signals fed from the SOC's group of sharing VGB's, and (0.7d) the SOC of each sharing group is configurable to selectively output its received feedthrough signals, each to one or both of the specialized lines in differently-directed ones of the VGB-interconnecting channels that extend adjacent to that SOC;

and wherein said FPGA configuring method comprises:

(c) programming at least a second of said VGB's to produce a respective first feedthrough signal from input term signals acquired by the second VGB from at least one of the differently-directed, VGB-interconnecting channels that extend adjacent to that first VGB; and (d) programming a corresponding second SOC that is shared by the sharing group of the second VGB so that the second SOC outputs the first feedthrough signal to at least one of the specialized lines in the differently-directed ones of the VGB-interconnecting channels that extend adjacent to that SOC.

14. The FPGA configuring method of claim 14 wherein:

(c.1) the programming of the at least a second VGB includes further programming the at least second VGB to synthesize a respective second, and relatively complex function signal from at least 5 of the input term signals acquired by the at least second VGB such that, due to duplicative rerouting of one or more of the at least second VGB's acquired input term signals in the post-acquisition decoder circuit of the at least second VGB, certain others of the acquired input term signals of the at least second VGB are freed to serve as feedthrough signals.

15. The FPGA configuring method of claim 14 wherein said FPGA configuring method comprises:

(e) programming at least a SOC-sharing group of third VGB's to produce a sufficiently large number of relatively primitive function signals such that the correspondingly shared SOC of the group of third VGB's cannot output all the respective and relatively primitive function signals of the group of third VGB's to corresponding, specialized lines in the differently-directed ones of the VGB-interconnecting channels that extend adjacent to that SOC of the group of third VGB's; and (f) routing excess ones of said sufficiently large number of relatively primitive function signals to input term signal acquiring fingers of others of said VGB's where the others of said VGB's can alternatively feedthrough the excess signals to one or more shared SOC's of said others of the VGB's.

16. The FPGA configuring method of claim 12 wherein:

(0.1a) at least some of the specialized lines each continuously spans a distance corresponding to a full side dimension of said array of VGB's.

17. The FPGA configuring method of claim 12 wherein:

(0.1a) at least some of the specialized lines each continuously spans a distance corresponding to half of a full side dimension of said array of VGB's.

18. The FPGA configuring method of claim 12 wherein:

(0.2a) each of the at least two, differently-directed VGB-interconnecting channels extending adjacent to each VGB includes:

(b.2a1) a short-haul, linear general interconnect line extending continuously for a distance of at least 2 VGB's but less than a linear distance fully across the array formed by said VGB's; and (b.2a2) an intermediate-haul, linear general interconnect line extending continuously for a distance of at least 4 VGB's but less than a linear distance fully across an array formed by said VGB's;

and wherein said FPGA configuring method comprises:

(c) programming at least one input term signal acquiring finger to acquire its respective input term signal form at least one of said short-haul, linear general interconnect line and intermediate-haul, linear general interconnect line.

19. The FPGA configuring method of claim 18 wherein:

each of the at least two, differently-directed VGB-interconnecting channels extending adjacent to each VGB further includes:

(b.2a3) a nonlinear direct connect line extending continuously and being dedicated for broadcasting a signal from a correspondingly dedicated, source one of said VGB's to a corresponding cluster of neighboring ones of said VGB's; and wherein said FPGA configuring method comprises:

(d) programming at least another input term signal acquiring finger to acquire its respective input term signal form said direct connect line.

20. The FPGA configuring method of claim 12 wherein:

(0.7c) each SOC-sharing group has at least four VGB's.

21. The FPGA configuring method of claim 12 wherein:

(0.7b1) each SOC is configurable to respond or not to a dynamic selection-control signal that is supply-able from the respective SOC-sharing group of VGB's and when configured to respond to such a dynamic selection-control signal, to accordingly selectively output its received function signals to said specialized lines;

and wherein said FPGA configuring method comprises:

(c) programming at least one VGB in a respective SOC-sharing group of VGB's to acquire a control signal by way of one of the control signal acquiring fingers of that at least one VGB and to supply the acquired control signal as a potential dynamic selection-control signal to the correspondingly shared SOC.

22. The FPGA configuring method of claim 12 wherein:

(0.7b1) each SOC includes a plurality of tristate line-drivers coupled to respectively drive corresponding ones of said specialized lines, where each tristate line-driver has an output-enable terminal for selectively enabling and disabling a corresponding output of the driver;

(0.7b2) each SOC is configurable to respond or not to a dynamic output-enable control signal that is supplyable from the respective SOC-sharing group of VGB's and when configured to respond to such a dynamic output-enable control signal, to accordingly couple the dynamic output-enable control signal to the output-enable terminal of a corresponding tristate line-driver in the SOC;

and wherein said FPGA configuring method comprises:

(c) programming at least one VGB in a respective SOC-sharing group of VGB's to acquire a control signal by way of one of the control signal acquiring fingers of that at least one VGB and to supply the acquired control signal as a potential dynamic output-enable control signal to the correspondingly shared SOC.

23. A programmed FPGA device comprising:

(a) a plurality of variable grain blocks (VGB's) disposed as an array in the FPGA device;

(b) a plurality of differently-directed, VGB-interconnecting channels each having specialized lines, each specialized line being for transmitting a given first function signal sourced from a respectively given first VGB adjacent to the specialized line, the transmission being to corresponding others of the VGB's that are arbitrarily distal from the respectively given first VGB by a distance that is within the reach of the specialized VGB-interconnecting line and along one or the other of the different directions of the specialized line's respective VGB-interconnecting channel, said VGB-interconnecting channels also including general-interconnect resources that can be programmed to alternatively or additionally transmit the first function signal from a respectively given VGB and through one or more switchboxes to corresponding others of the VGB's, said transmission through the switchboxes causing a greater signal propagation delay than said corresponding transmission through one or more of the specialized lines;

(b.1) wherein each specialized line continuously spans a distance of at least 8 VGB's;

(b.2) wherein each VGB has two differently-directed, VGB-interconnecting channels extending adjacent to that VGB;

(b.3) wherein each VGB includes input term signal acquiring fingers each for independently and selectively acquiring a respective input term signal from an adjacent interconnect channel, the input term signal acquiring fingers of the VGB being able to acquire their input term signals from the differently-directed, VGB-interconnecting channels that extend adjacent to that VGB;

(b.4) wherein each VGB includes programmably-compoundable and independently-configurable, function building blocks that are coupled to the VGB's input term signal acquiring fingers and that can independently produce from the acquired input term signals, respective ones of primitive function signals and can, if compounded-together, produce a corresponding one or more, more complex function signals;

(b.5) wherein each VGB includes a programmably-configurable, post-acquisition decoder circuit interposed between the VGB's input term signal acquiring fingers and the VGB's function building blocks for transparently passing the VGB's acquired input term signals to, or duplicatively rerouting one or more of the VGB's acquired input term signals to, the VGB's function building blocks so as to support respective synthesizings of said primitive function signals and said more complex function signals in the VGB;

(b.6) wherein for each sharing group of at least two VGB's, the FPGA device has a corresponding, shared output component (SOC) that is coupled to the sharing group and to the specialized lines in differently-directed, VGB-interconnecting channels that extend adjacent to that SOC, where:

(0.6a) the SOC is configurable to selectively receive respective function signals produced from the SOC's group of sharing VGB's, and (0.6b) the SOC is configurable to selectively output its received function signals, each to one or both of the specialized lines in differently-directed ones of the VGB-interconnecting channels that extend adjacent to that SOC;

and wherein said programmed FPGA device is characterized by:

(c) at least a first one of said VGB's being programmed to produce a respective first function signal from input term signals acquired by the first VGB from at least one of the differently-directed, VGB-interconnecting channels that extend adjacent to that first VGB; and (d) a corresponding first SOC that is shared by the sharing group of the first VGB being programmed so that the first SOC outputs the first function signal to at least one of the specialized lines in the differently-directed ones of the VGB-interconnecting channels that extend adjacent to that first SOC.

24. The programmed FPGA device of claim 23 wherein:

(0.5a) the programmably-configurable, post-acquisition decoder circuit of each VGB includes a feedthrough mechanism which can be programmed to feed certain ones of the acquired input term signals through the VGB's function building blocks without using the fedthrough signals for synthesizing said primitive function signals and to instead pass the fedthrough signals to the corresponding SOC that is shared by the sharing group of the VGB;

(0.6c) the SOC of each sharing group is configurable to selectively receive respective fedthrough signals fed from the SOC's group of sharing VGB's, and (0.6d) the SOC of each sharing group is configurable to selectively output its received feedthrough signals, each to one or both of the specialized lines in differently-directed ones of the VGB-interconnecting channels that extend adjacent to that SOC; and wherein said programmed FPGA is further characterized by:

(e) at least a second of said VGB's being programmed to produce a respective first feedthrough signal from input term signals acquired by the second VGB from at least one of the differently-directed, VGB-interconnecting channels that extend adjacent to that first VGB; and (d) a corresponding second SOC that is shared by the sharing group of the second VGB being programmed so that the second SOC outputs the first feedthrough signal to at least one of the specialized lines in the differently-directed ones of the VGB-interconnecting channels that extend adjacent to that SOC.

25. The programmed FPGA device of claim 24 wherein said programmed FPGA is further characterized by:

(c.1) at least a second VGB being programmed to synthesize a respective second, and relatively complex function signal from at least 5 of the input term signals acquired by the at least second VGB such that, due to duplicative rerouting of one or more of the at least second VGB's acquired input term signals in the post-acquisition decoder circuit of the at least second VGB, certain others of the acquired input term signals of the at least second VGB are freed to serve as feedthrough signals.

26. The programmed FPGA device of claim 25 wherein said programmed FPGA is further characterized by:

(e) at least a SOC-sharing group of third VGB's being programmed to produce a sufficiently large number of relatively primitive function signals such that the correspondingly shared SOC of the group of third VGB's cannot output all the respective and relatively primitive function signals of the group of third VGB's to corresponding, specialized lines in the differently-directed ones of the VGB-interconnecting channels that extend adjacent to that SOC of the group of third VGB's; and (f) the interconnect of the FPGA being programmed to route excess ones of said sufficiently large number of relatively primitive function signals to input term signal acquiring fingers of others of said VGB's where the others of said VGB's are programmed to alternatively feedthrough the excess signals to one or more shared SOC's of said others of the VGB's.

27. The programmed FPGA device of claim 23 wherein:

(0.1a) at least some of the specialized lines each continuously spans a distance corresponding to a full side dimension of said array of VGB's.

28. The programmed FPGA device of claim 23 wherein:

(0.1a) at least some of the specialized lines each continuously spans a distance corresponding to half of a full side dimension of said array of VGB's.

29. The programmed FPGA device of claim 23 wherein:

(0.2a) each of the at least two, differently-directed VGB-interconnecting channels extending adjacent to each VGB includes:

(b.2a1) a short-haul, linear general interconnect line extending continuously for a distance of at least 2 VGB's but less than a linear distance fully across the array formed by said VGB's; and (b.2a2) an intermediate-haul, linear general interconnect line extending continuously for a distance of at least 4 VGB's but less than a linear distance fully across an array formed by said VGB's;

and wherein said programmed FPGA is further characterized by:

(c) at least one input term signal acquiring finger being programmed to acquire its respective input term signal form at least one of said short-haul, linear general interconnect line and intermediate-haul, linear general interconnect line.

30. The programmed FPGA device of claim 29 wherein:

each of the at least two, differently-directed VGB-interconnecting channels extending adjacent to each VGB further includes:

(b.2a3) a nonlinear direct connect line extending continuously and being dedicated for broadcasting a signal from a correspondingly dedicated, source one of said VGB's to a corresponding cluster of neighboring ones of said VGB's; and wherein said programmed FPGA is further characterized by:

(d) at least another input term signal acquiring finger being programmed to acquire its respective input term signal form said direct connect line.

31. The programmed FPGA device of claim 23 wherein:

(0.6c) each SOC-sharing group has at least four VGB's.

32. The programmed FPGA device of claim 23 wherein:

(b.7) wherein each VGB includes control signal acquiring fingers each for independently and selectively acquiring a respective control signal from an adjacent interconnect channel, the control signal acquiring fingers of the VGB being able to acquire their control signals from the differently-directed, VGB-interconnecting channels that extend adjacent to that VGB;

(0.6b1) each SOC is configurable to respond or not to a dynamic selection-control signal that is supply-able from the respective SOC-sharing group of VGB's and when configured to respond to such a dynamic selection-control signal, to accordingly selectively output its received function signals to said specialized lines; and wherein said programmed FPGA is further characterized by:

(c) at least one VGB in a respective SOC-sharing group of VGB's being programmed to acquire a control signal by way of one of the control signal acquiring fingers of that at least one VGB and to supply the acquired control signal as a potential dynamic selection-control signal to the correspondingly shared SOC.

33. The programmed FPGA device of claim 23 wherein:

(0.6b1) each SOC includes a plurality of tristate line-drivers coupled to respectively drive corresponding ones of said specialized lines, where each tristate line-driver has an output-enable terminal for selectively enabling and disabling a corresponding output of the driver;

(0.6b2) each SOC is configurable to respond or not to a dynamic output-enable control signal that is supply-able from the respective SOC-sharing group of VGB's and when configured to respond to such a dynamic output-enable control signal, to accordingly couple the dynamic output-enable control signal to the output-enable terminal of a corresponding tristate line-driver in the SOC;

and wherein said programmed FPGA is further characterized by:

(c) at least one VGB in a respective SOC-sharing group of VGB's being programmed to acquire a control signal by way of one of the control signal acquiring fingers of that at least one VGB and to supply the acquired control signal as a potential dynamic output-enable control signal to the correspondingly shared SOC.

* * * * *

UNITED STATES PATENT AND TRADEMARK OFFICE
CERTIFICATE OF CORRECTION

PATENT NO. : 6,204,686 B1
DATED : March 20, 2001
INVENTOR(S) : Agrawal et al.

It is certified that error appears in the above-identified patent and that said Letters Patent is hereby corrected as shown below:

Column 33,
Line 54, "differently-directed." should be -- differently-directed, --.

Column 34,
Line 53, "east" should be -- least --.
Line 64, "an" should be -- and --.

Column 37,
Line 58, "claim 14" should be -- claim 13 --.

Column 38,
Lines 44 and 61, "form" should be -- from --.

Column 41,
Line 64, "form" should be -- from --.

Column 42,
Line 15, "form" should be -- from --.

Signed and Sealed this

Twenty-fifth Day of June, 2002

Attest:

JAMES E. ROGAN
*Attesting Officer*   *Director of the United States Patent and Trademark Office*